(12) United States Patent
Choi et al.

(10) Patent No.: US 12,107,049 B2
(45) Date of Patent: Oct. 1, 2024

(54) SEMICONDUCTOR DEVICE HAVING DOPED INTERLAYER INSULATING LAYER

(71) Applicant: Samsung Electronics Co., Ltd., Suwon-si (KR)

(72) Inventors: Younseok Choi, Seoul (KR); Byungsun Park, Suwon-si (KR); Youngil Lee, Wonju-si (KR); Jaechul Lee, Hwaseong-si (KR); Jiwoon Im, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 484 days.

(21) Appl. No.: 17/481,609

(22) Filed: Sep. 22, 2021

(65) Prior Publication Data
US 2022/0223524 A1    Jul. 14, 2022

(30) Foreign Application Priority Data

Jan. 13, 2021   (KR) .................. 10-2021-0004568

(51) Int. Cl.
*H01L 23/528*     (2006.01)
*H01L 21/768*     (2006.01)
*H01L 23/532*     (2006.01)
*H01L 23/535*     (2006.01)
*H10B 41/27*      (2023.01)
(Continued)

(52) U.S. Cl.
CPC ...... *H01L 23/535* (2013.01); *H01L 21/76805* (2013.01); *H01L 21/76895* (2013.01); *H01L 23/5283* (2013.01); *H01L 23/5329* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS 6,376,382 B1    4/2002  Chiou et al.
8,211,804 B2    7/2012  Lee et al.
(Continued)

FOREIGN PATENT DOCUMENTS

CN          1525533 A      9/2004
CN        110120382 A      8/2019
(Continued)

*Primary Examiner* — Eric A. Ward
(74) *Attorney, Agent, or Firm* — Muir Patent Law, PLLC

(57) ABSTRACT

A semiconductor device includes a lower memory stack disposed on a substrate and including lower gate electrodes and a lower staircase structure, an upper memory stack including upper gate electrodes and an upper staircase structure, a lower interlayer insulating layer doped with an impurity and covering the lower staircase structure, the lower interlayer insulating layer having a doping concentration gradually increasing toward the lower staircase structure, an upper interlayer insulating layer doped with an impurity and covering the upper staircase structure and the lower interlayer insulating layer, the upper interlayer insulating layer having a doping concentration gradually increasing toward the upper staircase structure and the lower interlayer insulating layer, lower contact plugs and upper contact plugs contacting the lower gate electrodes and the upper gate electrodes, respectively.

19 Claims, 33 Drawing Sheets

(51) Int. Cl.
    *H10B 41/41*     (2023.01)
    *H10B 43/27*     (2023.01)
    *H10B 43/40*     (2023.01)

(56) References Cited

U.S. PATENT DOCUMENTS

| | | |
|---|---|---|
| 9,627,469 B2 | 4/2017 | Yi et al. |
| 10,658,366 B2 | 5/2020 | Liao et al. |
| 2019/0273088 A1* | 9/2019 | Cui ................... H01L 29/7883 |
| 2020/0243528 A1* | 7/2020 | Shreeram ............... H10B 12/37 |
| 2021/0125660 A1* | 4/2021 | Maejima .................. G11C 5/06 |
| 2021/0210499 A1* | 7/2021 | Jhothiraman .......... H10B 43/35 |

FOREIGN PATENT DOCUMENTS

| | | |
|---|---|---|
| KR | 20050070307 A | 7/2005 |
| KR | 20060077253 A | 7/2006 |

\* cited by examiner

FIG. 4
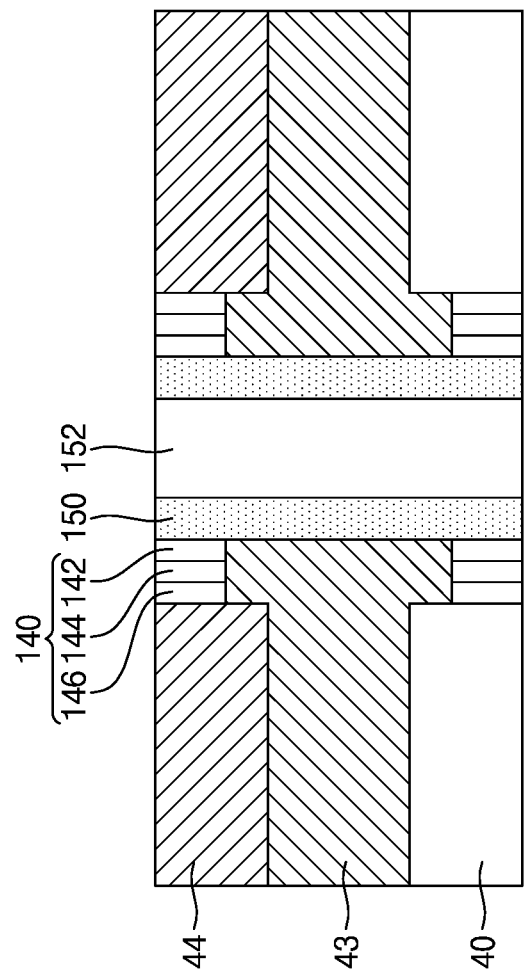
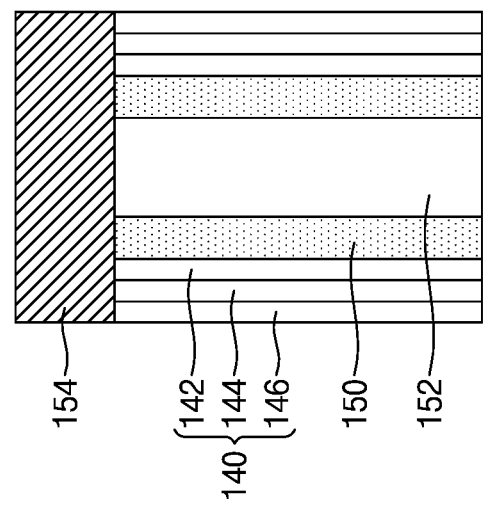

FIG. 12A
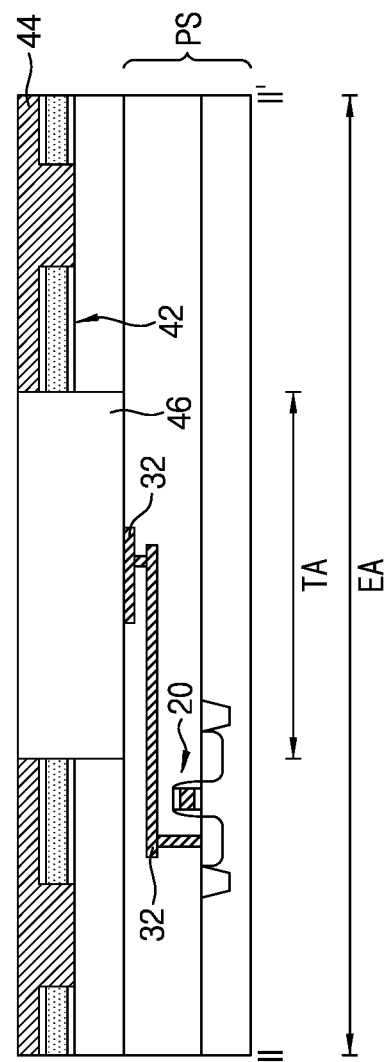
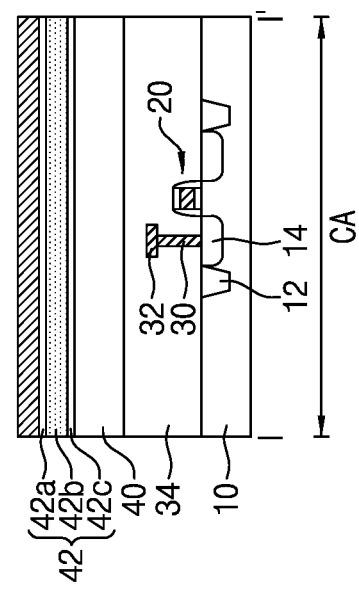

FIG. 13A
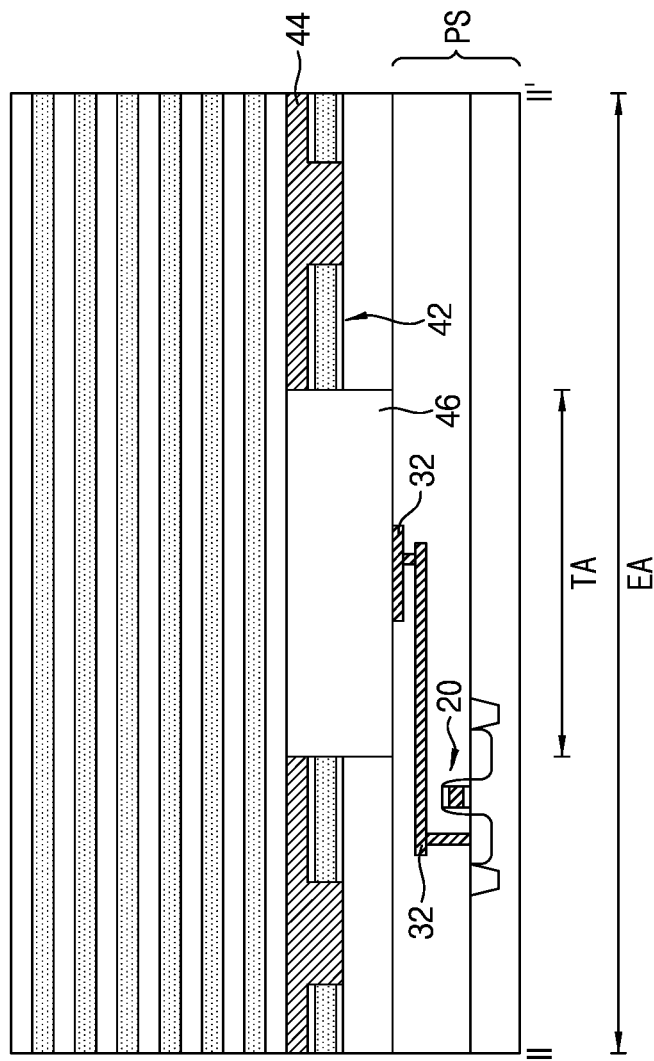
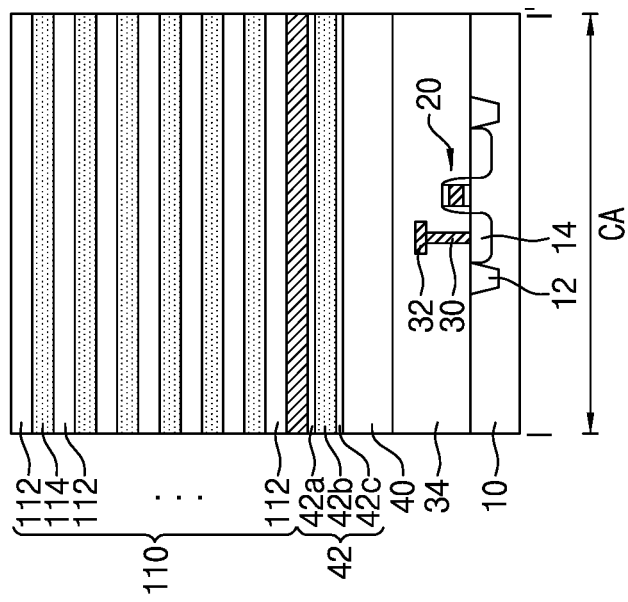

FIG. 15A
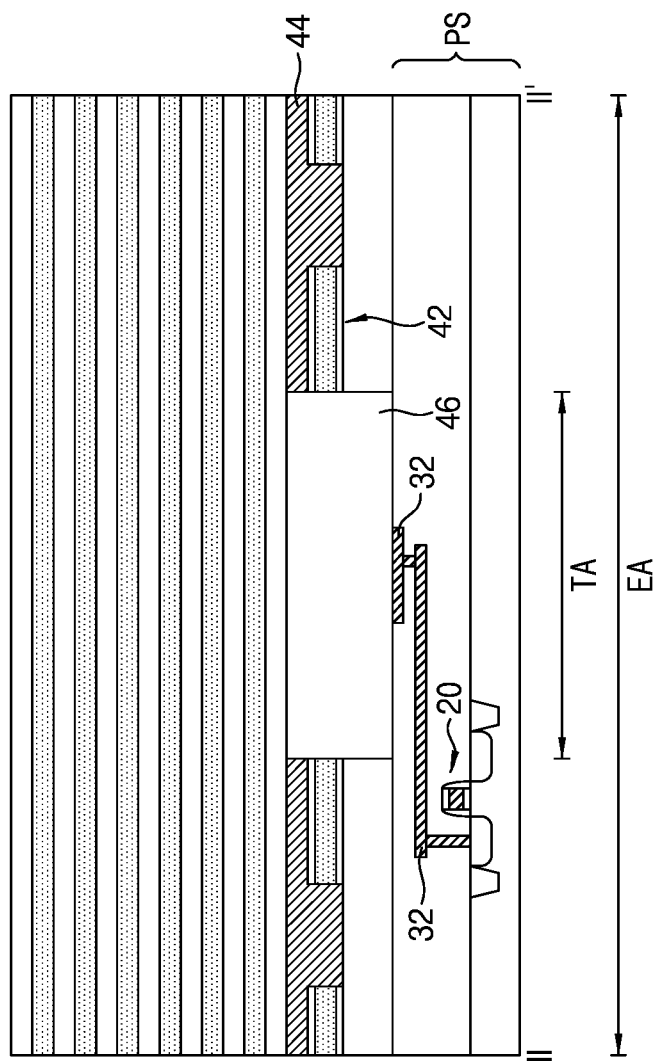
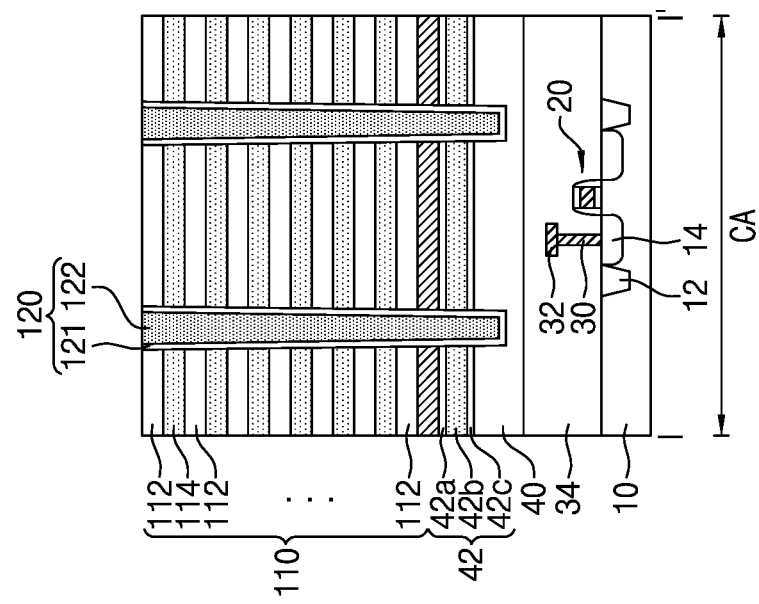

FIG. 16A
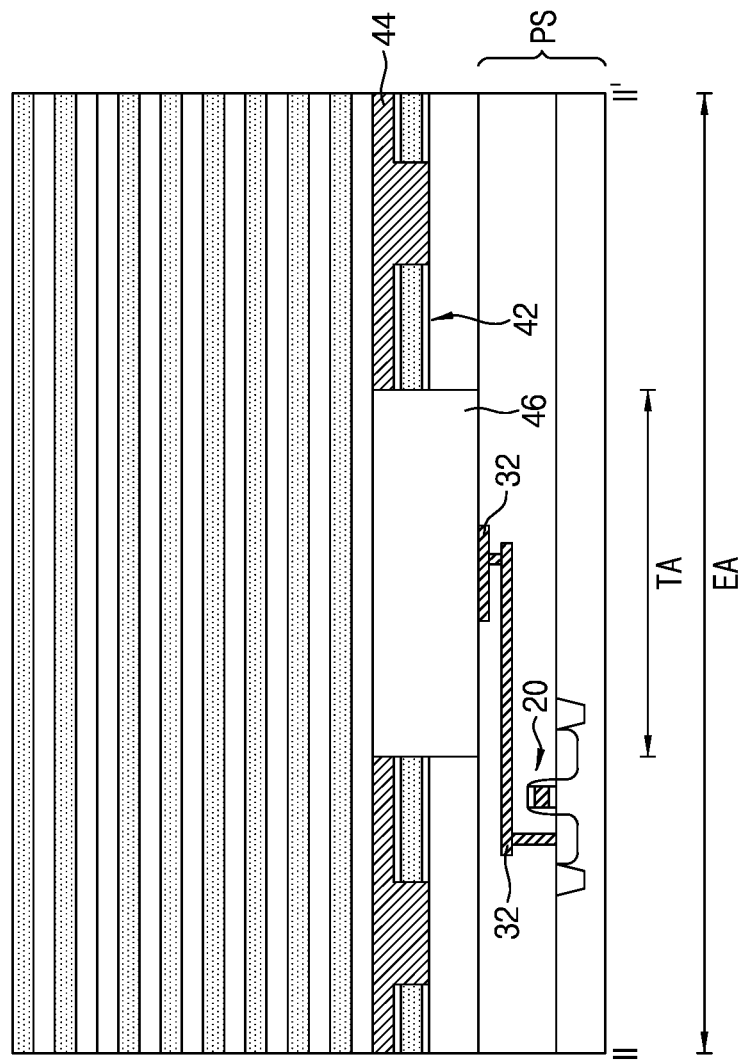
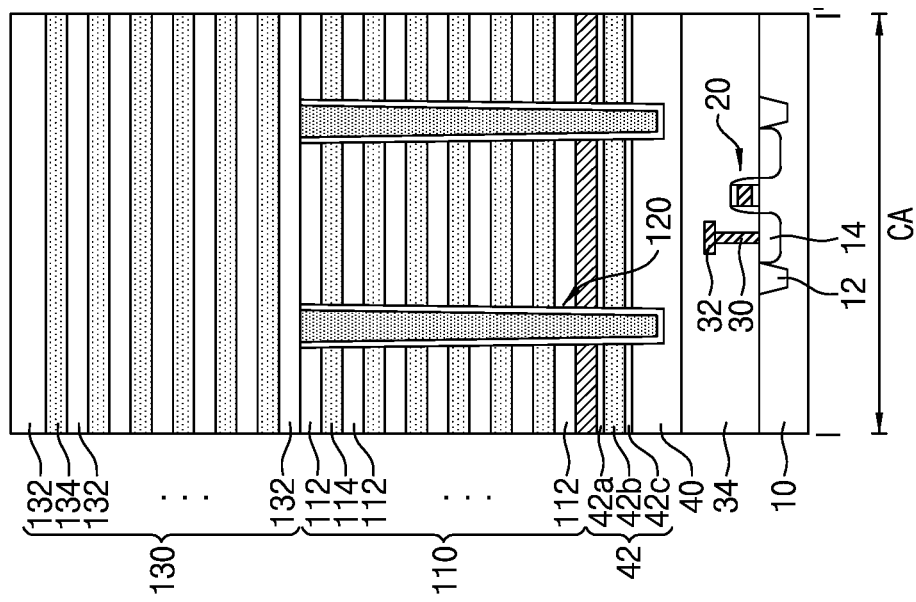

FIG. 17A
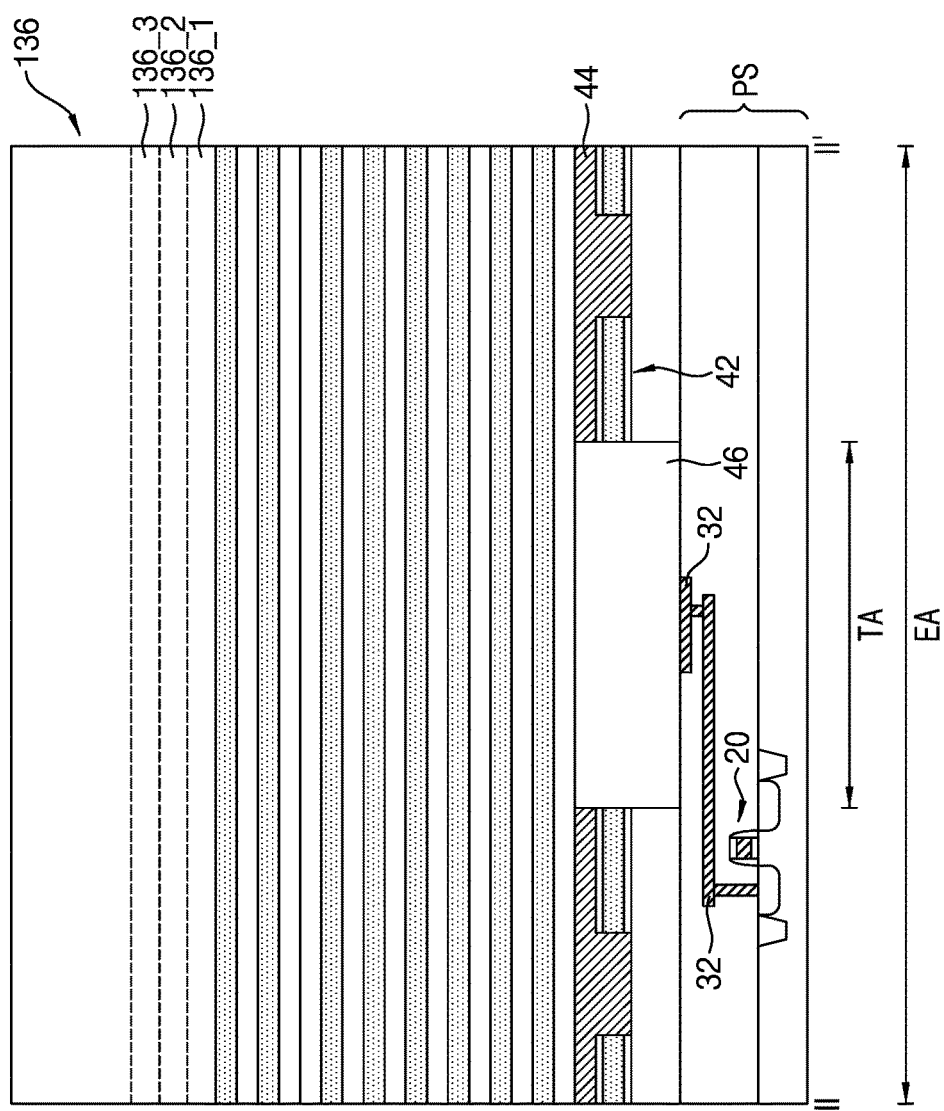
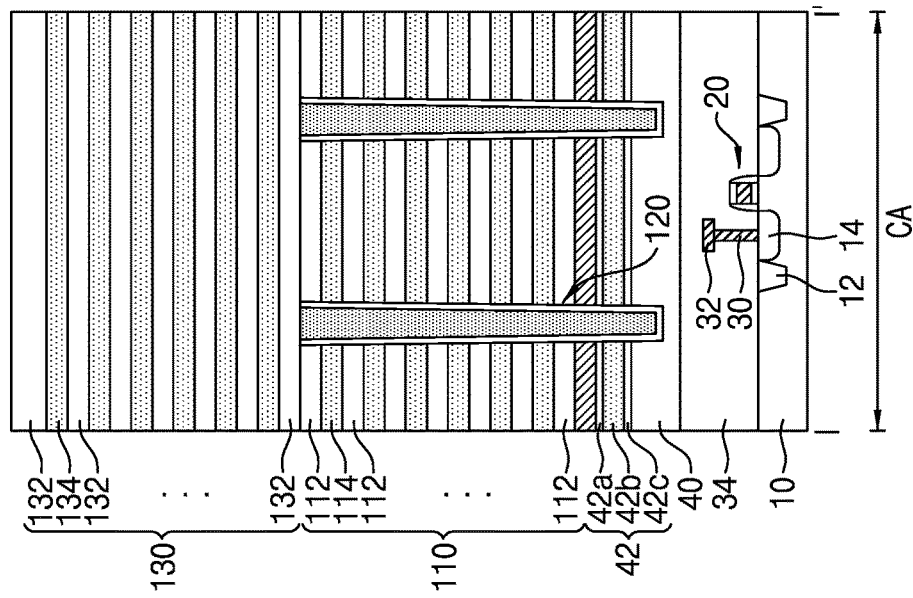

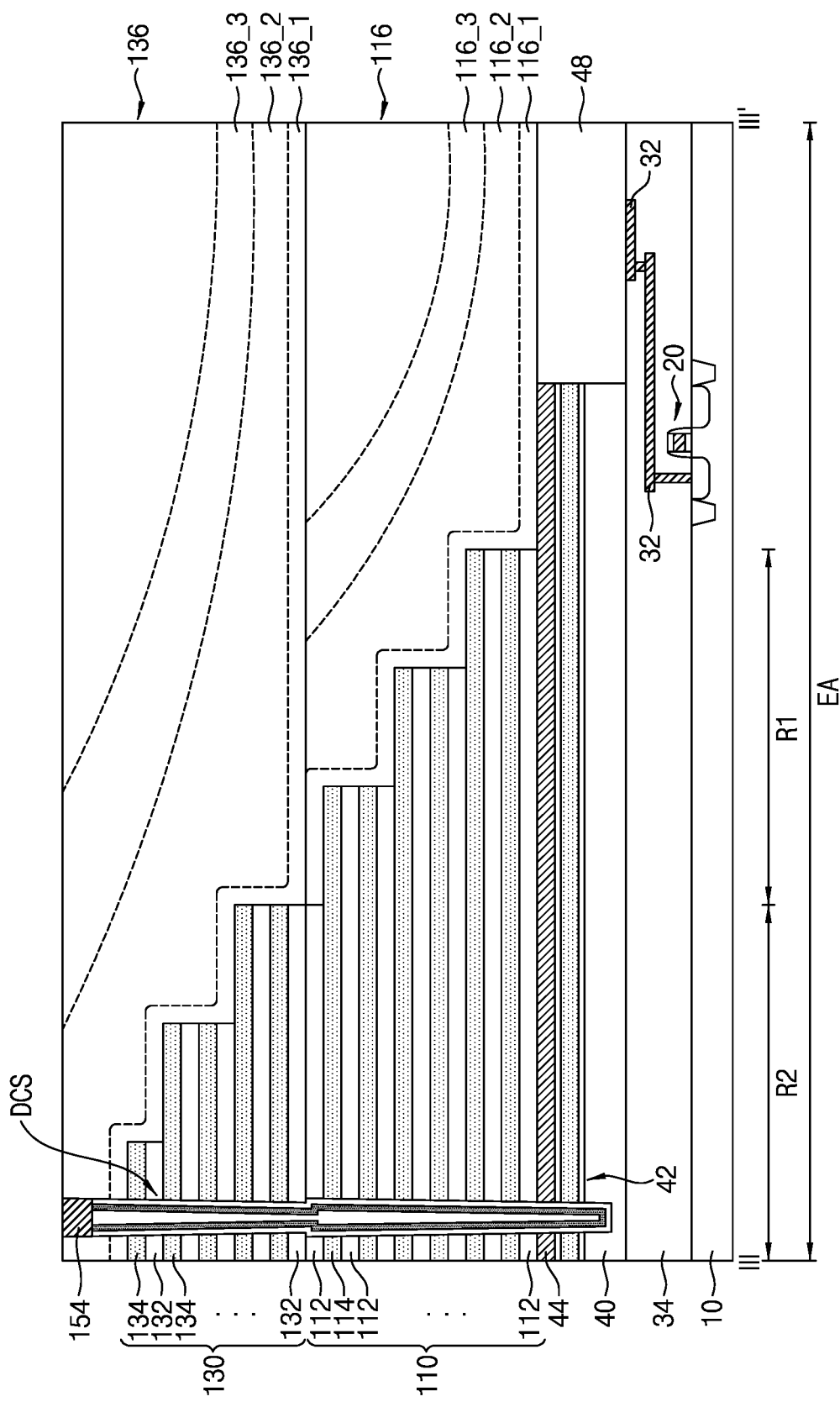

SEMICONDUCTOR DEVICE HAVING DOPED INTERLAYER INSULATING LAYER

CROSS-REFERENCE TO THE RELATED APPLICATION

This application claims priority from Korean Patent Application No. 10-2021-0004568, filed on Jan. 13, 2021, in the Korean Intellectual Property Office, the disclosure of which is incorporated herein by reference in its entirety.

BACKGROUND

1. Field

The exemplary embodiments of the disclosure relate to a semiconductor device having an interlayer insulating layer.

2. Description of the Related Art

A 3-dimensional nonvolatile memory device having a multi-stack structure has been proposed for lightweight and/or thinner electronic products and miniaturization and high integration of such electronic products. Such a nonvolatile memory device includes gate electrodes, an interlayer insulating layer covering the gate electrodes, and contact plugs extending through the interlayer insulating layer, to contact the gate electrodes.

SUMMARY

The exemplary embodiments of the disclosure provide a semiconductor device having a doped interlayer insulating layer.

A semiconductor device according to exemplary embodiments of the disclosure may include a substrate including a cell array area and an extension area, a lower memory stack disposed on the substrate and including lower gate electrodes vertically stacked and spaced apart from one another, the lower memory stack including, at the extension area, a lower staircase structure in which the lower gate electrodes are stacked to have a staircase shape, an upper memory stack disposed on the lower memory stack and including upper gate electrodes vertically stacked and spaced apart from one another, the upper memory stack including, at the extension area, an upper staircase structure in which the upper gate electrodes are stacked to have a staircase shape, a plurality of channel structures extending through the lower memory stack and the upper memory stack at the cell array area, a lower interlayer insulating layer doped with an impurity and covering the lower staircase structure, the lower interlayer insulating layer having a doping concentration gradually increasing toward the lower staircase structure, an upper interlayer insulating layer doped with an impurity and covering the upper staircase structure and the lower interlayer insulating layer, the upper interlayer insulating layer having a doping concentration gradually increasing toward the upper staircase structure and the lower interlayer insulating layer, lower contact plugs contacting the lower gate electrodes of the lower staircase structure, and upper contact plugs contacting the upper gate electrodes of the upper staircase structure.

A semiconductor device according to exemplary embodiments of the disclosure may include a peripheral circuit structure including a substrate, the substrate including a cell array area and an extension area, a lower conductive layer on the peripheral circuit structure, a supporter on the lower conductive layer, a memory stack disposed on the supporter and including gate electrodes vertically stacked and spaced apart from one another, the memory stack including, at the extension area, a staircase structure in which the gate electrodes are stacked to have a staircase shape, a plurality of channel structures extending through the memory stack at the cell array area, an interlayer insulating layer doped with an impurity and covering the staircase structure, the interlayer insulating layer including a first doping region, a second doping region on the first doping region, and a third doping region on the second doping region, and contact plugs contacting the gate electrodes of the staircase structure. The first doping region may extend along an upper surface of the staircase structure and extending horizontally along an upper surface of the supporter. A doping concentration of the interlayer insulating layer may gradually increase toward the staircase structure and the supporter.

An electronic system according to exemplary embodiments of the disclosure may include a main substrate, a semiconductor device on the main substrate, and a controller electrically connected to the semiconductor device on the main substrate. The semiconductor device may include a substrate including a cell array area and an extension area, a lower memory stack disposed on the substrate and including lower gate electrodes vertically stacked and spaced apart from one another, the lower memory stack including, at the extension area, a lower staircase structure in which the lower gate electrodes are stacked to have a staircase shape, an upper memory stack disposed on the lower memory stack and including upper gate electrodes vertically stacked and spaced apart from one another, the upper memory stack including, at the extension area, an upper staircase structure in which the upper gate electrodes are stacked to have a staircase shape, a plurality of channel structures extending through the lower memory stack and the upper memory stack at the cell array area, a lower interlayer insulating layer doped with an impurity and covering the lower staircase structure, the lower interlayer insulating layer having a doping concentration gradually increasing toward the lower staircase structure, an upper interlayer insulating layer doped with an impurity and covering the upper staircase structure and the lower interlayer insulating layer, the upper interlayer insulating layer having a doping concentration gradually increasing toward the upper staircase structure and the lower interlayer insulating layer, lower contact plugs contacting the lower gate electrodes of the lower staircase structure, and upper contact plugs contacting the upper gate electrodes of the upper staircase structure, a peripheral circuit structure between the substrate and the lower memory stack, and an input/output pad electrically interconnecting the peripheral circuit structure and the controller.

BRIEF DESCRIPTION OF THE DRAWINGS

The above and other objects, features, and advantages of the inventive concept will become more apparent to those skilled in the art upon consideration of the following detailed description with reference to the accompanying drawings.

FIG. 4 is an enlarged view of the semiconductor device shown in FIG. 2.

FIGS. 12A, 12B, 13A, 13B, 14, 15A to 20A, 15B to 20B, and 21 to 23 are vertical cross-sectional views illustrating in process order of a method of manufacturing a semiconductor device shown in FIGS. 2 and 3.

DETAILED DESCRIPTION OF EXEMPLARY EMBODIMENTS

Figure 1:
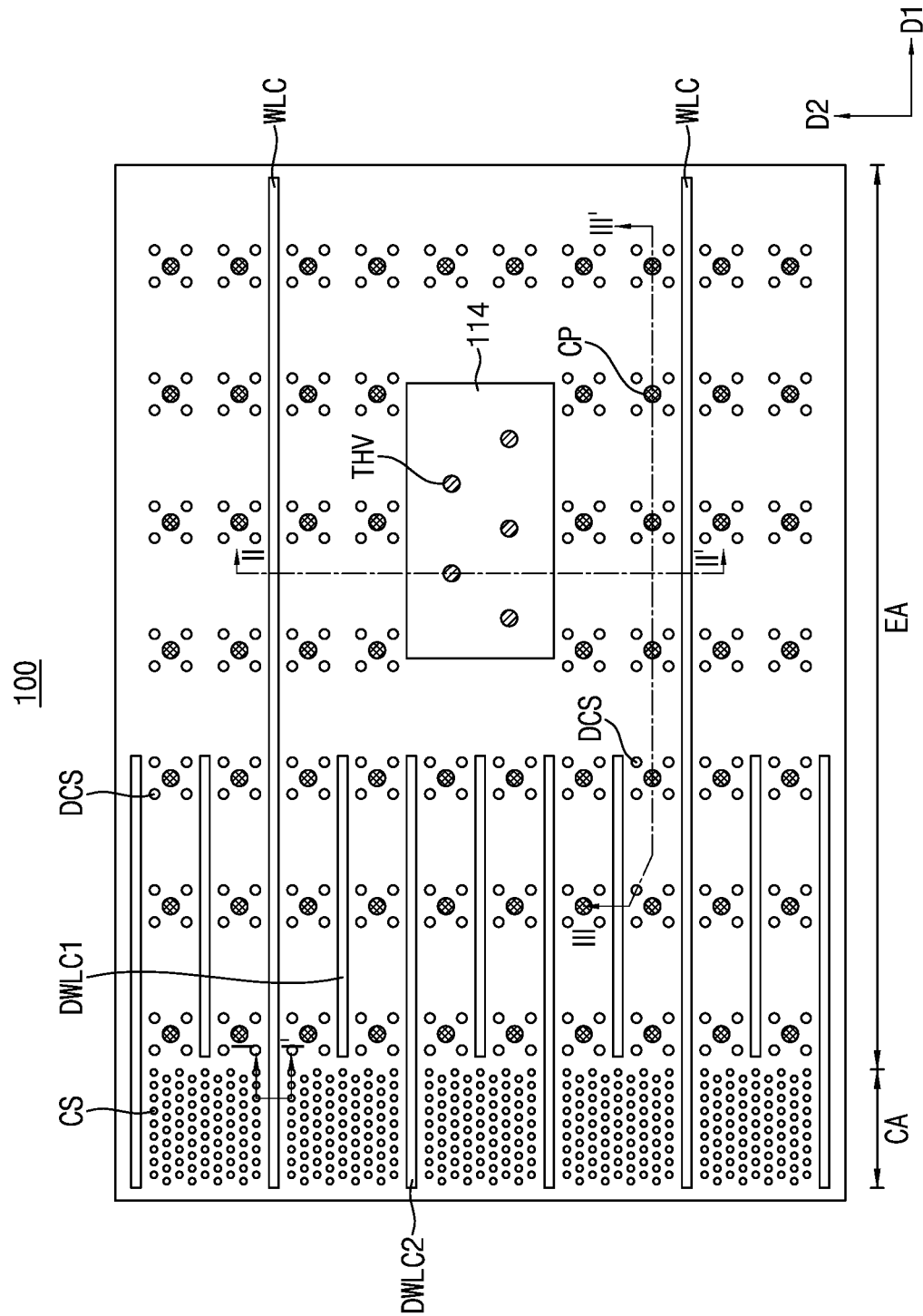
FIG. 1 is a layout of a semiconductor device according to an example embodiment of the inventive concepts.
Figure 2:
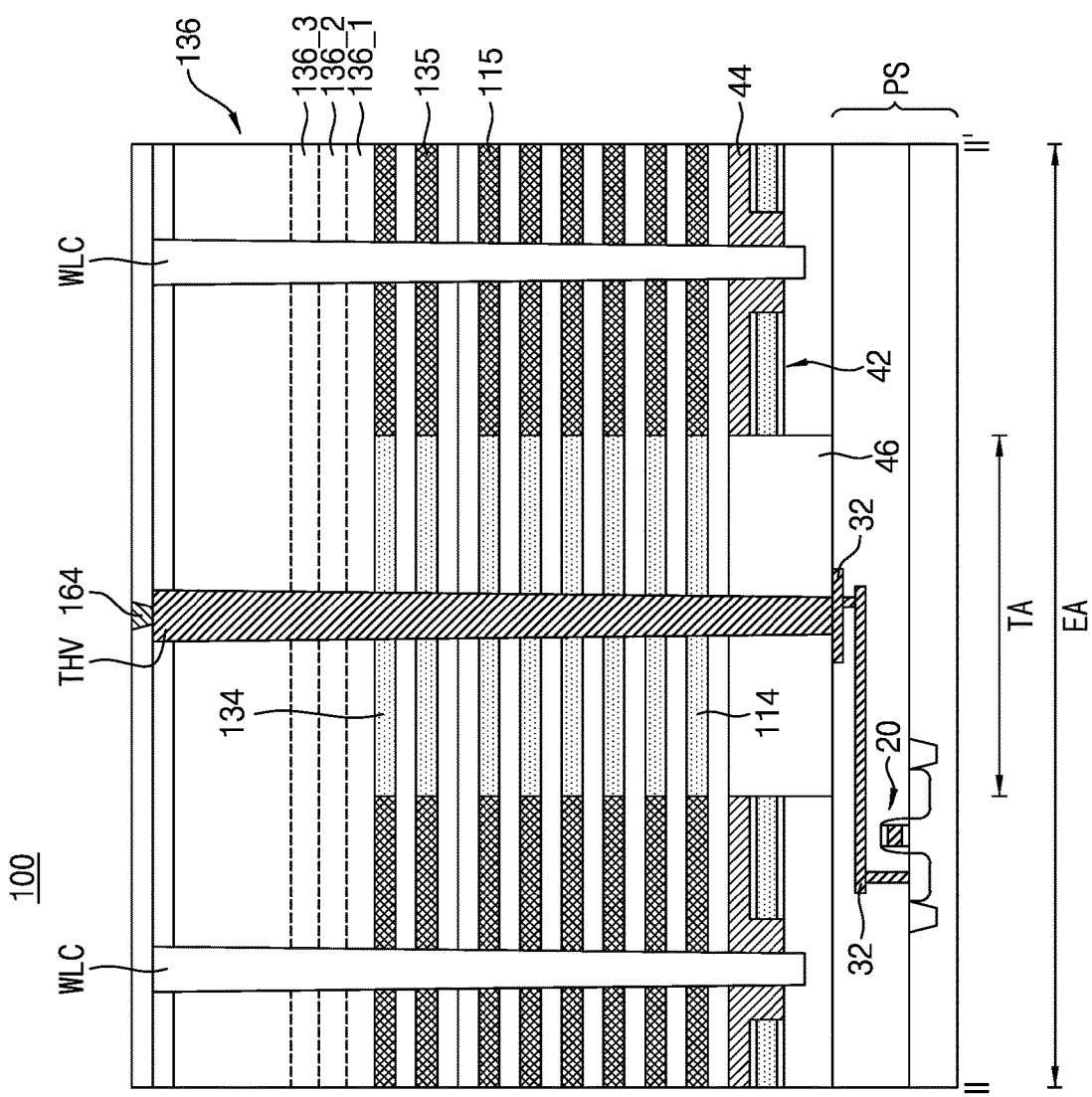
FIG. 2 are vertical cross-sectional views taken along line I-I' and II-II' of the semiconductor device shown in FIG. 1.
Figure 3:
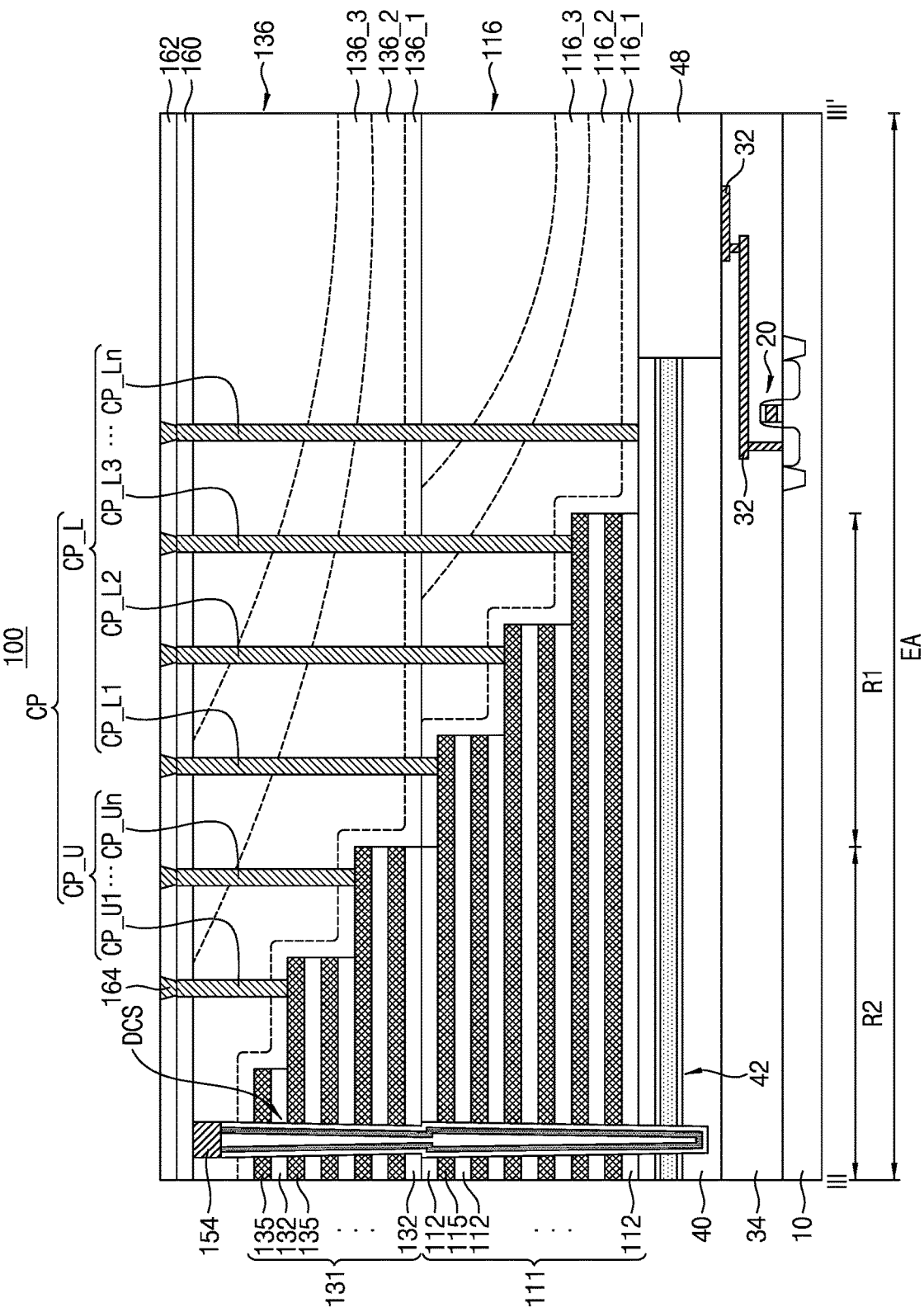
FIG. 3 is a vertical cross-sectional view taken along line of the semiconductor device shown in FIG. 1.

FIG. 1 is a layout of a semiconductor device according to an example embodiment of the inventive concepts. FIG. 2 are vertical cross-sectional views taken along line I-I' and II-II' of the semiconductor device shown in FIG. 1. FIG. 3 is a vertical cross-sectional view taken along line of the semiconductor device shown in FIG. 1. Semiconductor devices according to the exemplary embodiments of the disclosure may include flash memory such as 3D-NAND.

Referring to FIG. 1, a semiconductor device 100 may include a cell array area CA and an extension area EA. The cell array area CA may include channel structures CS. The extension area EA may include pad areas PA, and a through electrode area TA including dummy channel structures DCS and through electrodes THV.

The semiconductor device 100 may include isolation insulating layers WLC, first dummy isolation insulating layers DWLC1, and second dummy isolation insulating layers DWLC2. The isolation insulating layers WLC may extend through the cell array area CA and the extension area EA in a first horizontal direction D1. The isolation insulating layers WLC may be spaced apart from each other in a second horizontal direction D2. The first dummy isolation insulating layers DWLC1 and the second dummy isolation insulating layers DWLC2 may be disposed between the isolation insulating layers WLC and extending in the first horizontal direction D1. The first dummy isolation insulating layers DWLC1 may be disposed in the extension area EA, whereas the second dummy isolation insulating layers DWLC2 may further extend to the cell array area CA.

Referring to FIGS. 2 and 3, the semiconductor device 100 may include a peripheral circuit structure PS, a lower memory stack 111, a lower interlayer insulating layer 116, an upper memory stack 131, an upper interlayer insulating layer 136, channel structures CS, dummy channel structures DCS, contact plugs CP, and through electrodes THV. The semiconductor device 100 according to the exemplary embodiment of the disclosure may have a cell-over-peripheral (COP) structure and a multi-stack structure. For example, the peripheral circuit structure PS may be disposed under the lower memory stack 111, and the upper memory stack 131 may be disposed on the lower memory stack 111. The peripheral circuit structure PS may be formed on a substrate 10, and may include a device isolation layer 12, an impurity region 14, a transistor 20, a peripheral contact plug 30, a peripheral circuit wiring 32, and a peripheral insulating layer 34.

The device isolation layer 12 and the impurity region 14 may be disposed at an upper surface of the substrate 10. The transistor 20, the peripheral contact plug 30 and the peripheral circuit wiring 32 may be disposed on the substrate 10. The substrate 10 may include or may be formed of a semiconductor material. For example, the substrate 10 may be a silicon substrate, a germanium substrate, a silicon germanium substrate, or a silicon-on-insulator (SOI) substrate. In an embodiment, the substrate 10 may include or may be formed of a group IV semiconductor, a group III-V compound semiconductor, or a group II-VI oxide semiconductor.

The impurity region 14 may be disposed adjacent to the transistor 20. The peripheral insulating layer 34 may cover the transistor 20 and the peripheral contact plug 30. The peripheral contact plug 30 may be electrically connected to the impurity region 14. The peripheral circuit wiring 32 may be connected to the peripheral contact plug 30.

The semiconductor device 100 may include a lower conductive layer 40, a connecting mold layer 42, a connecting conductive layer 43, a supporter 44, an electrode insulating layer 46 and a buried insulating layer 48, which are disposed between the peripheral circuit structure PS and the lower memory stack 111. The lower conductive layer 40 may be disposed on the peripheral insulating layer 34. In an embodiment, the lower conductive layer 40 may include or may be formed of doped polysilicon. The connecting mold layer 42 and the connecting conductive layer 43 may be disposed on the lower conductive layer 40. The connecting mold layer 42 may be disposed in the extension area EA while contacting the dummy channel structures DCS. The connecting conductive layer 43 may be disposed in the cell array area CA while contacting the channel structures CS. The supporter 44 may cover the connecting conductive layer 43 in the cell array area CA, and may cover the connecting mold layer 42 in the extension area EA while contacting an upper surface of the lower conductive layer 40. The electrode insulating layer 46 may be disposed in the extension area EA. For example, the electrode insulating layer 46 may be disposed in the through electrode area TA, and may extend through the lower conductive layer 40 and the supporter 44, to contact the peripheral circuit structure PS. The buried insulating layer 48 may be disposed in the extension area EA, and may extend through the lower conductive layer 40 and the supporter 44, to contact the peripheral circuit structure PS.

The lower memory stack 111 may be disposed on the supporter 44. The lower memory stack 111 may include lower insulating layers 112, lower mold layers 114, and lower gate electrodes 115. The lower gate electrodes 115 may be stacked alternately with the lower insulating layers 112. The lower gate electrodes 115 and the lower insulating layers 112 may extend in a horizontal direction. The lower mold layers 114 may be disposed in the through electrode area TA, and may be stacked alternately with the lower insulating layers 112. Each lower mold layer 114 may be disposed at the same level as a corresponding one of the lower gate electrodes 115.

The lower memory stack 111 may include a lower staircase structure in the extension area EA (for example, corresponding to an area designated by "R1" in FIG. 3). The lower staircase structure may represent a structure extending from an end of the lower memory stack 111 while having a staircase shape. For example, the lower staircase structure may have a staircase shape in which a lower gate electrode 115 disposed at a relatively lower position from among the lower gate electrodes 115 has a greater length than a lower gate electrode 115 disposed at a relatively upper position from among the lower gate electrodes 115.

At least one of the lower gate electrodes 115 disposed at a lower portion of the lower memory stack 111 may be a ground selection line (GSL). In an embodiment, the lower insulating layers 112 may include or may be formed of silicon oxide, and the lower mold layers 114 may include or may be formed of silicon nitride. The lower gate electrodes 115 may include or may be formed of tungsten.

The semiconductor device 100 may include a lower interlayer insulating layer 116. The lower interlayer insulating layer 116 may cover the lower staircase structure, the supporter 44 and the buried insulating layer 48. In an embodiment, the lower interlayer insulating layer 116 may be doped with an impurity. For example, the lower interlayer insulating layer 116 may include or may be formed of silicon oxide, and may be doped with the impurity such as boron (B), phosphorous (P), fluorine (F), and a combination thereof. In an embodiment, the doping concentration of the lower interlayer insulating layer 116 may gradually increase as the lower interlayer insulating layer 116 extends downwards (i.e., increase toward the bottom of the lower interlayer insulating layer 116).

FIG. 3 illustrates a first lower doping region 116_1, a second lower doping region 116_2 and a third lower doping region 116_3 of the lower interlayer insulating layer 116. The first lower doping region 116_1 may extend along upper surfaces of the lower staircase structure, the supporter 44 and the buried insulating layer 48. The second lower doping region 116_2 may be disposed on the first lower doping region 116_1. The third lower doping region 116_3 may be disposed on the second lower doping region 116_2. The doping concentration of the first lower doping region 116_1 may be higher than the doping concentration of the second lower doping region 116_2. The doping concentration of the second lower doping region 116_2 may be higher than the doping concentration of the third lower doping region 116_3. Specifically, the average doping concentration of the lower doped region 116_1 may be higher than that of the second lower doped region 116_2, and the average doping concentration of the second lower doped region 116_2 may be higher than the average doping concentration of the third lower doped region 116_3. Alternatively, the doping concentration of any portion of the lower doped region 116_1 may be higher than the doping concentration of any portion of the second lower doped region 116_2, and the doping concentration of any portion of the second lower doped region 116_2 may be higher than the doping concentration of any portion of the third lower doped region 116_3. As such, the doping concentration of the lower interlayer insulating layer 116 may gradually increase as the lower interlayer insulating layer 116 becomes nearer to the lower staircase structure, the supporter 44, and the buried insulating layer 48 (i.e., increase toward the lower staircase structure, the supporter 44, and the buried insulating layer 48). For example, the first lower doping region 116_1 may be a region having the highest doping concentration in the lower interlayer insulating layer 116.

The upper memory stack 131 may be disposed on the lower memory stack 111. The upper memory stack 131 may include upper insulating layers 132, upper mold layers 134 and upper gate electrodes 135. The upper gate electrodes 135 may be stacked alternately with the upper insulating layers 132. The upper gate electrodes 135 and the upper insulating layers 132 may extend in a horizontal direction. The upper mold layers 134 may be disposed in the through electrode area TA, and may be stacked alternately with the upper insulating layers 132. Each upper mold layer 134 may be disposed at the same level as a corresponding one of the upper gate electrodes 135.

The upper memory stack 131 may include an upper staircase structure in the extension area EA (for example, corresponding to an area designated by "R2" in FIG. 3). The upper staircase structure may represent a structure extending from an end of the upper memory stack 131 while having a staircase shape. For example, the upper staircase structure may have a staircase shape in which an upper gate electrode 135 disposed at a relatively lower position from among the upper gate electrodes 135 has a greater length than an upper gate electrode 135 disposed at a relatively upper position from among the upper gate electrodes 135.

At least one of the gate electrodes disposed at an upper portion of the upper memory stack 131 may be a string selection line (SSL) or a drain selection line (DSL). In an embodiment, the upper insulating layers 132 may include or may be formed of silicon oxide, and the upper mold layers 134 may include or may be formed of silicon nitride. The upper gate electrodes 135 may include or may be formed of tungsten. Although two memory stacks, that is, the memory stacks 111 and 131, are shown in FIG. 3, the exemplary embodiments of the disclosure are not limited thereto. In an embodiment, the semiconductor device 100 may include a plurality of memory stacks.

The semiconductor device 100 may include an upper interlayer insulating layer 136. The upper interlayer insulating layer 136 may cover the upper staircase structure and the lower interlayer insulating layer 116. In an embodiment, the upper interlayer insulating layer 136 may be doped with an impurity. For example, the upper interlayer insulating layer 136 may include silicon oxide and may be doped with the impurity such as boron (B), phosphorous (P), fluorine (F), and a combination thereof. In an embodiment, the doping concentration of the upper interlayer insulating layer 136 may gradually increase as the upper interlayer insulating layer 136 extends downwards (i.e., increase toward the bottom of the upper interlayer insulating layer 136).

FIG. 3 illustrates a first upper doping region 136_1, a second upper doping region 136_2 and a third upper doping region 136_3 of the upper interlayer insulating layer 136. The first upper doping region 136_1 may extend along upper surfaces of the upper staircase structure and the lower interlayer insulating layer 116. The second upper doping region 136_2 may be disposed on the first upper doping region 136_1. The third upper doping region 136_3 may be disposed on the second upper doping region 136_2. The doping concentration of the first upper doping region 136_1 may be higher than the doping concentration of the second upper doping region 136_2. The doping concentration of the second upper doping region 136_2 may be higher than the doping concentration of the third upper doping region 136_3. As such, the doping concentration of the upper interlayer insulating layer 136 may gradually increase as the upper interlayer insulating layer 136 becomes nearer to the upper staircase structure and the lower interlayer insulating layer 116. For example, the first upper doping region 136_1 may be a region having the highest doping concentration in the upper interlayer insulating layer 136.

The first upper doping region 136_1 may partially contact the first lower doping region 116_1, the second lower doping region 116_2 and the third lower doping region 116_3. Accordingly, the doping concentration of a lower surface of the upper interlayer insulating layer 136 may differ from the doping concentration of the upper surface of the lower interlayer insulating layer 116. In an embodiment, the doping concentration of the lower surface of the upper interlayer insulating layer 136 may be equal to the doping concentration of a portion of the upper surface of the lower interlayer insulating layer 116. In some embodiment, the upper interlayer insulating layer 136 and the lower interlayer insulating layer 116 may include or may be formed of an insulating material (e.g., silicon oxide). In some embodiment, the impurity of the upper interlayer insulating layer 136 may be the same as that of the lower interlayer insulating layer 116. For example, the impurity may be boron (B), phosphorous (P), fluorine (F), and a combination thereof.

Each of the lower interlayer insulating layer 116 and the upper interlayer insulating layer 136 may exhibit a higher wet etching rate as the doping concentration thereof becomes higher. As the length of each contact plug CP increases, the horizontal width of the contact plug CP at a lower surface of the contact plug CP may be decreased. In order to uniformize the horizontal width of the contact plug CP, accordingly, the lower interlayer insulating layer 116 and the upper interlayer insulating layer 136 may have a doping concentration gradually increasing as the lower interlayer insulating layer 116 and the upper interlayer insulating layer 136 extend downwards. In an embodiment, the doping concentration of the first lower doping region 116_1 may be higher than the doping concentration of the first upper doping region 136_1.

The first lower doping region 116_1, the second lower doping region 116_2, the third lower doping region 116_3, the first upper doping region 136_1, the second upper doping region 136_2 and the third upper doping region 136_3 shown in FIG. 3 are illustrative and, as such, the exemplary embodiments of the disclosure are not limited thereto. For example, the lower interlayer insulating layer 116 may include a plurality of lower doping regions, and the upper interlayer insulating layer 136 may include a plurality of upper doping regions. The plurality of lower doping regions are materially contiguous with one another and, as such, may form a single layer. The plurality of upper doping regions may be materially contiguous with one another and, as such, may form a single layer.

The channel structures CS may extend through the connecting conductive layer 43, the supporter 44, the lower memory stack 111 and the upper memory stack 131 in a vertical direction in the cell array area CA. Conductive pads 154 may be disposed over the channel structures CS, respectively. The channel structures CS may be electrically connected to the connecting conductive layer 43. The conductive pads 154 may be disposed on the channel structures CS, respectively. In an embodiment, each channel structure CS may have a tapered shape such that the horizontal width of the channel structure CS is gradually reduced as the channel structure CS extends downwards. A side surface of each channel structure CS may have a step between the lower memory stack 111 and the upper memory stack 131.

The dummy channel structures DCS may be disposed in the extension area EA, and may extend through the connecting mold layer 42, the supporter 44, the lower memory stack 111 and the upper memory stack 131. The dummy channel structures DCS may include a configuration identical or similar to that of the channel structures CS.

The semiconductor device 100 may include a first upper insulating layer 160 on the upper interlayer insulating layer 136. The first upper insulating layer 160 may cover upper surfaces of the upper interlayer insulating layer 136 and the conductive pads 154. The first upper insulating layer 160 may include or may be formed of silicon oxide.

The isolation insulating layers WLC may be disposed in the cell array area CA and the extension area EA, and may extend through the lower memory stack 111, the upper memory stack 131 and the first upper insulating layer 160. In addition, the isolation insulating layers WLC in the cell array area CA may extend through the connecting conductive layer 43 and the supporter 44. The isolation insulating layers WLC in the extension area EA may extend through the supporter 44. In an embodiment, each isolation insulating layer WLC may have a tapered shape such that the horizontal width of the isolation insulating layer WLC is gradually reduced as the isolation insulating layer WLC extends downwards. The isolation insulating layers WLC may include or may be formed of silicon oxide, silicon nitride, silicon oxynitride, or a combination thereof. In an embodiment, the isolation insulating layers WLC may include or may be formed of silicon oxide.

The semiconductor device 100 may include a through electrode THV in the through electrode area TA. The through electrode THV may extend vertically through the electrode insulating layer 46, the lower memory stack 111, the upper memory stack 131, the upper interlayer insulating layer 136 and the first upper insulating layer 160. The through electrode THV may be electrically connected to the peripheral circuit structure PS, and may be electrically insulated from the lower gate electrodes 115 and the upper gate electrodes 135. For example, a lower surface of the through electrode THV may contact the peripheral circuit wiring 32, and a side surface of the through electrode THV may contact the lower mold layers 114 and the upper mold layers 134. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

The semiconductor device 100 may include lower contact plugs CP_L respectively connected to the lower gate electrodes 115, and upper contact plugs CP_U respectively connected to the upper gate electrodes 135. For example, each of the lower contact plugs CP_L may contact an upper surface of a corresponding one of the lower gate electrodes 115 while extending vertically through the lower interlayer insulating layer 116, the upper interlayer insulating layer 136 and the first upper insulating layer 160. At least one of the lower contact plugs CP_L may contact the upper surface of the supporter 44. Each of the upper contact plugs CP_U may contact an upper surface of a corresponding one of the upper gate electrodes 135 while extending vertically through the upper interlayer insulating layer 136 and the first upper insulating layer 160. The lower contact plugs CP_L are designated by reference numerals "CP_L1" "CP_L2" "CP_L3" . . . , and "CP_Ln" in the order nearer to the cell array area CA (or the order of smaller lengths), respectively. The upper contact plugs CP_U are designated by reference numerals "CP_U1", "CP_U2", "CP_U3" . . . , and "CP_Un" in the order nearer to the cell array area CA (or the order of smaller lengths), respectively. Although four lower contact plugs CP_L and two upper contact plugs CP_U are shown in FIG. 3, the exemplary embodiments of the disclosure are not limited thereto.

In an embodiment, horizontal widths of the lower contact plugs CP_L and the upper contact plugs CP_U may be uniform, without being limited thereto. A lower portion of each lower contact plug CP_L may contact the first lower doping region 116_1. A lower portion of each upper contact plug CP_U may contact the first upper doping region 136_1. For example, the first lower doping region 116_1 may extend along the upper surfaces of the lower staircase structure, the supporter 44 and the buried insulating layer 48, and may contact the lower portions of the lower contact plugs CP_L. The first upper doping region 136_1 may extend along the upper surfaces of the upper staircase structure and the lower interlayer insulating layer 116, and may contact the lower portions of the upper contact plugs CP_U. The first upper doping region 136_1 may also contact the lower contact plugs CP_L.

The semiconductor device 100 may include a second upper insulating layer 162 and studs 164. The second upper insulating layer 162 may be disposed on the first upper insulating layer 160. The studs 164 may contact the channel structures CS, the through electrode THV and the contact plugs CP, respectively, while extending through the second upper insulating layer 162. However, the studs 164 may not contact the dummy channel structures DCS.

FIG. 4 is an enlarged view of the semiconductor device shown in FIG. 2. FIG. 4 shows upper and lower portions of one channel structure CS.

Referring to FIG. 4, the channel structure CS may include an information storage layer 140, a channel layer 150, and a buried insulating pattern 152. The channel layer 150 may be disposed inside the information storage layer 140. The buried insulating pattern 152 may be disposed inside the channel layer 150. The information storage layer 140 may include a tunnel insulating layer 142, a charge storage layer 144, and a blocking layer 146. The charge storage layer 144 may be disposed inside the blocking layer 146. The tunnel insulating layer 142 may be disposed inside the charge storage layer 144. In an embodiment, the channel layer 150 may include or may be formed of polysilicon. The buried insulating pattern 152 may include or may be formed of silicon oxide, silicon nitride, silicon oxynitride, or a combination thereof. In an embodiment, the blocking layer 146 and the tunnel insulating layer 142 may include or may be formed of silicon oxide, whereas the charge storage layer 144 may include or may be formed of silicon nitride. The channel layer 150 may be electrically connected to a corresponding one of the conductive pads 154.

The connecting conductive layer 43 may be disposed at an upper surface of the lower conductive layer 40, and may contact a side surface of the channel layer 150 while extending through the information storage layer 140. A portion of the connecting conductive layer 43, which contacts the channel layer 150, may extend in a vertical direction. The supporter 44 may be disposed on the connecting conductive layer 43.

Figure 5:
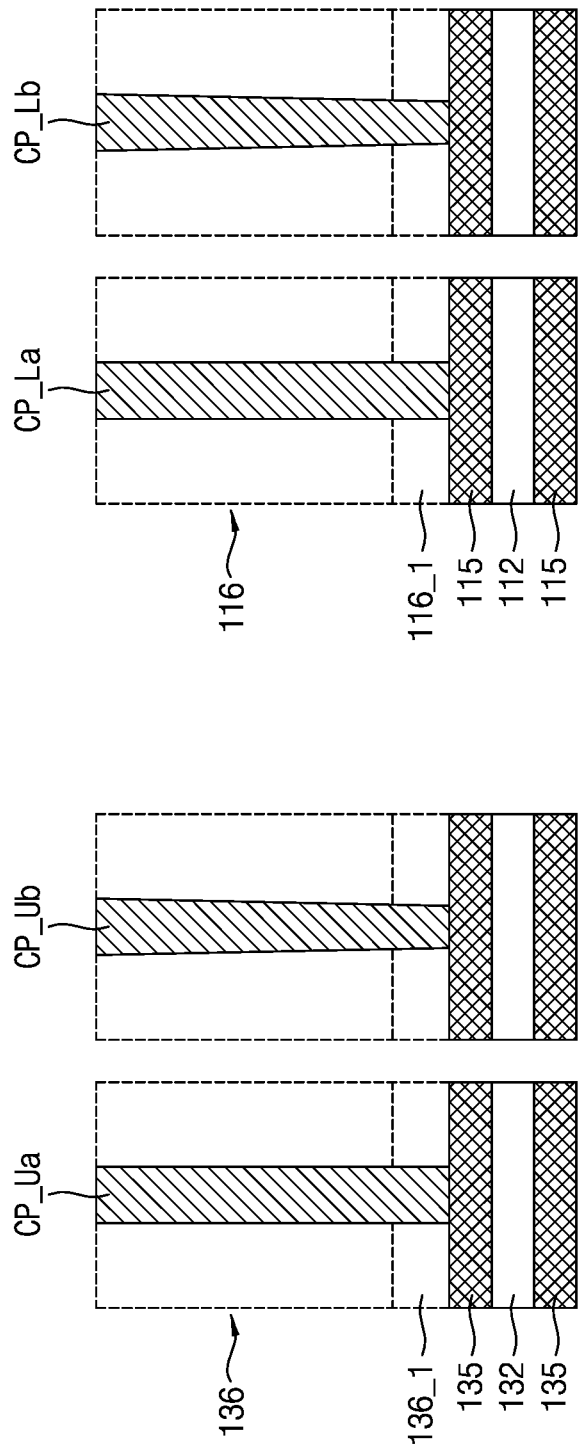
FIGS. 5 to 9 are enlarged views of semiconductor devices according to example embodiments of the inventive concepts.
Figure 6:
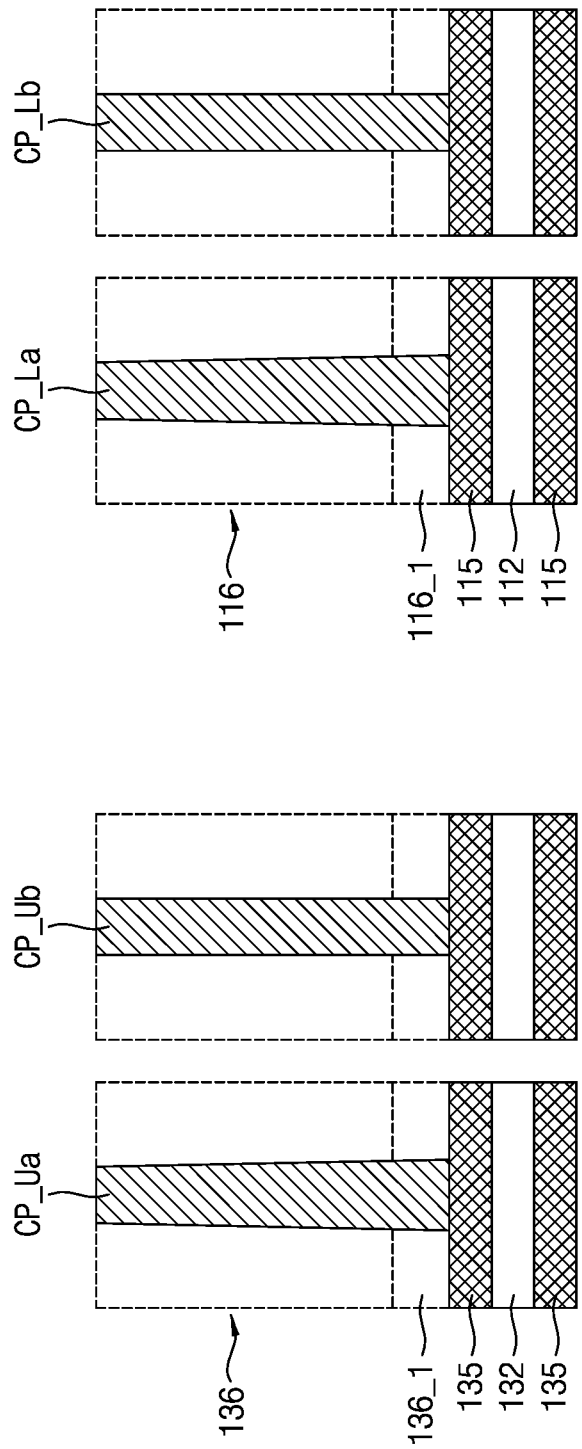
Figure 7:
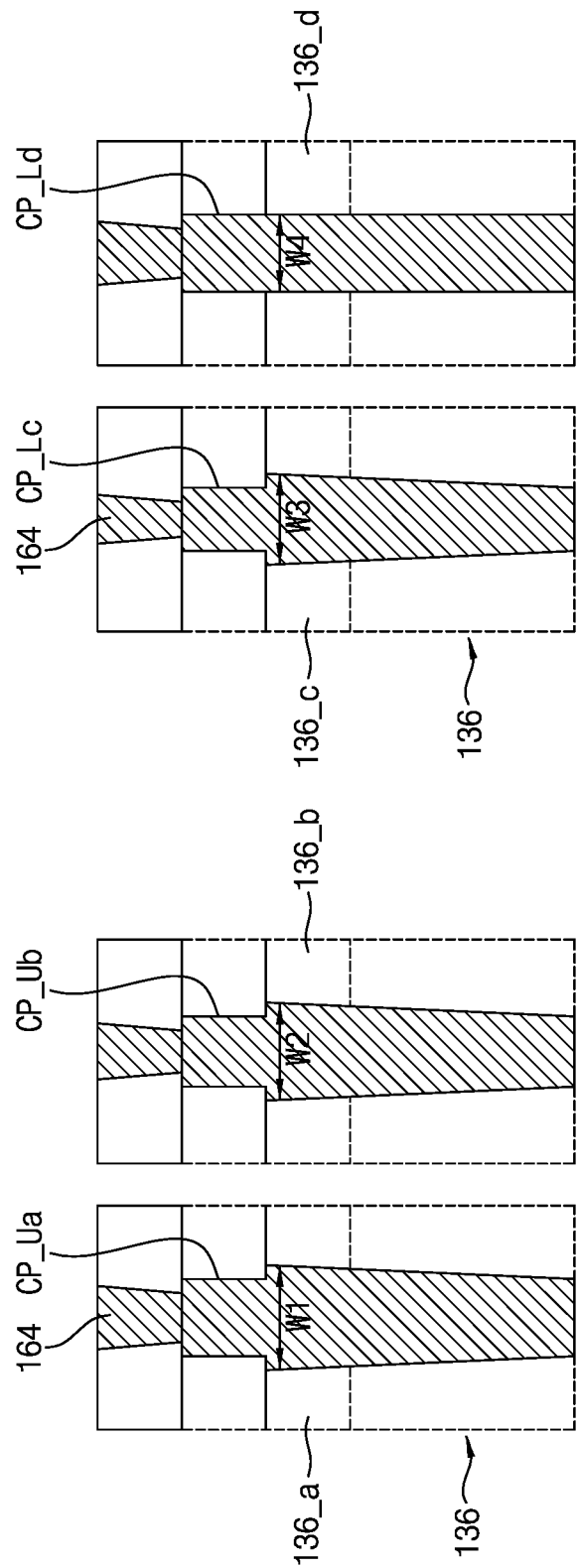
Figure 9:
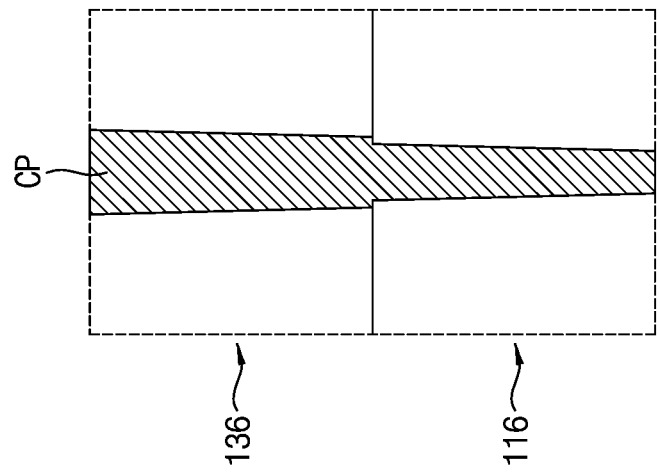
Figure 8:
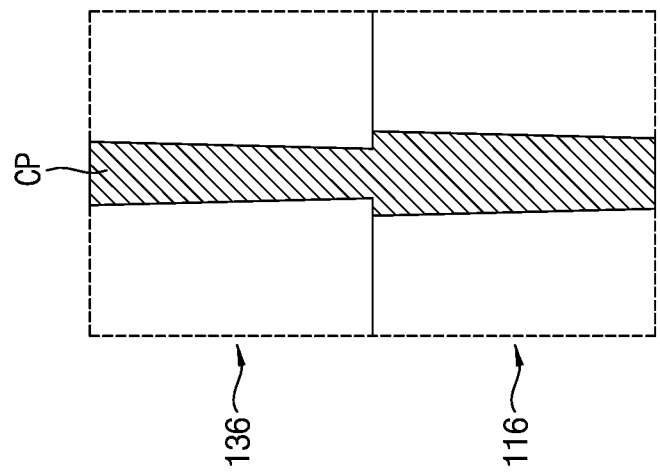

FIGS. 5 to 9 are enlarged views of semiconductor devices according to example embodiments of the inventive concepts. FIGS. 5 and 6 are vertical cross-sectional view of lower portions of the contact plugs CP. FIG. 7 is a vertical cross-sectional view of upper end portions of the contact plugs CP. FIGS. 8 and 9 are vertical cross-sectional views of the contact plugs CP near a boundary surface between the lower interlayer insulating layer 116 and the upper interlayer insulating layer 136.

Referring to FIG. 5, the semiconductor device 100 may include a first upper contact plug CP_Ua and a second upper contact plug CP_Ub which contact the upper gate electrode 135. The first upper contact plug CP_Ua may be nearer to the cell array area CA than the second upper contact plug CP_Ub, or the length (e.g., in the vertical direction) of the first upper contact plug CP_Ua may be smaller than the length of the second upper contact plug CP_Ub (for example, the case of b>a). Lower portions of the first upper contact plug CP_Ua and the second upper contact plug CP_Ub may contact the first upper doping region 136_1. In an embodiment, the horizontal width of a lower surface of the first upper contact plug CP_Ua may be greater than the horizontal width of a lower surface of the second upper contact plug CP_Ub. For example, the horizontal width of the first upper contact plug CP_Ua may be uniform, whereas the second upper contact plug CP_Ub may have a tapered shape in which the horizontal width of the second upper contact plug CP_Ub gradually decreases as the second upper contact plug CP_Ub extends downwards.

The semiconductor device 100 may include a first lower contact plug CP_La and a second lower contact plug CP_Lb which contact the lower gate electrode 115. The first lower contact plug CP_La may be nearer to the cell array area CA than the second lower contact plug CP_Lb, or the length of the first lower contact plug CP_La may be smaller than the length of the second lower contact plug CP_Lb (for example, the case of b>a). Lower portions of the first lower contact plug CP_La and the second lower contact plug CP_Lb may contact the first lower doping region 116_1. In an embodiment, the horizontal width of a lower surface of the first lower contact plug CP_La may be greater than the horizontal width of a lower surface of the second lower contact plug CP_Lb. For example, the horizontal width of the first lower contact plug CP_La may be substantially uniform, whereas the second lower contact plug CP_Lb may have a tapered shape in which the horizontal width of the second lower contact plug CP_Lb gradually decreases as the second lower contact plug CP_Lb extends downwards. Terms such as "same," "uniform," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially uniform," "substantially equal," or "substantially planar," may be exactly the same, equal, or planar, or may be the same, equal, or planar within acceptable variations that may occur, for example, due to manufacturing processes.

Referring to FIG. 6, the semiconductor device 100 may include a first upper contact plug CP_Ua and a second upper contact plug CP_Ub which contact the upper gate electrode 135. In an embodiment, the horizontal width of a lower surface of the first upper contact plug CP_Ua may be greater than the horizontal width of a lower surface of the second upper contact plug CP_Ub. For example, the horizontal width of the first upper contact plug CP_Ua may gradually increase as the first upper contact plug CP_Ua extends downwards, whereas the horizontal width of the second upper contact plug CP_Ub may be substantially uniform.

The semiconductor device 100 may include a first lower contact plug CP_La and a second lower contact plug CP_Lb which contact the lower gate electrode 115. In an embodiment, the horizontal width of a lower surface of the first lower contact plug CP_La may be greater than the horizontal width of a lower surface of the second lower contact plug CP_Lb. For example, the horizontal width of the first lower contact plug CP_La may gradually increase as the first lower contact plug CP_La extends downwards, whereas the second lower contact plug CP_Lb may be substantially uniform.

Referring to FIG. 7, the semiconductor device 100 may include a first upper contact plug CP_Ua, a second upper contact plug CP_Ub, a first lower contact plug CP_Lc and a second lower contact plug CP_Ld. The first upper contact plug CP_Ua, the second upper contact plug CP_Ub, the first lower contact plug CP_Lc and the second lower contact plug CP_Ld may be disposed in the order nearer to the cell array area CA or the order of smaller lengths (for example, a>b, c>d).

The upper interlayer insulating layer 136 may include a first upper doping region 136_a, a second upper doping region 136_b, a third upper doping region 136_c, and a fourth upper doping region 136_d disposed in the order of higher doping concentrations while contacting a lower surface of the first upper insulating layer 160. The first upper doping region 136_a, the second upper doping region 136_b, the third upper doping region 136_c and the fourth upper doping region 136_d may contact the first upper contact plug CP_Ua, the second upper contact plug CP_Ub, the first lower contact plug CP_Lc and the second lower contact plug CP_Ld, respectively.

In an embodiment, a first width W1 of the first upper contact plug CP_Ua may be greater than a second width W2 of the second upper contact plug CP_Ub. The second width W2 of the second upper contact plug CP_Ub may be greater than a third width W3 of the first lower contact plug CP_Lc. The third width W3 of the first lower contact plug CP_Lc may greater than a fourth width W4 of the second lower contact plug CP_Ld. The first to fourth widths W1 to W4 may represent horizontal widths of the first upper contact plug CP_Ua, the second upper contact plug CP_Ub, the first lower contact plug CP_Lc and the second lower contact plug CP_Ld at the same level as the upper surface of the upper interlayer insulating layer 136, respectively. In an embodiment, each of the first upper contact plug CP_Ua, the second upper contact plug CP_Ub, the first lower contact plug CP_Lc and the second lower contact plug CP_Ld may have a step at a boundary surface between the upper interlayer insulating layer 136 and the first upper insulating layer 160. For example, the first width W1, the second width W2 and the third width W3 may be greater than horizontal widths of the first upper contact plug CP_Ua, the second upper contact plug CP_Ub and the first lower contact plug CP_Lc at the first upper insulating layer 160, respectively. For example, each of the first upper contact plug CP_Ua, the second upper contact plug CP_Ub, the first lower contact plug CP_Lc and the second lower contact plug CP_Ld may have a stepped sidewall. However, the exemplary embodiments of the disclosure are not limited to the above-described conditions. In an embodiment, the first upper contact plug CP_Ua, the second upper contact plug CP_Ub and the first lower contact plug CP_Lc may have no step.

Referring to FIG. 8, the doping concentration of the upper surface of the upper interlayer insulating layer 136 may differ from the doping concentration of the upper surface of the lower interlayer insulating layer 116, as described above.

As such, in a process of forming contact holes CH, which will be described later, etching rates at the lower surface of the upper interlayer insulating layer 136 and the upper surface of the lower interlayer insulating layer 116 may differ from each other. In an embodiment, at least one of the contact plugs CP may have a step at the boundary surface between the lower interlayer insulating layer 116 and the upper interlayer insulating layer 136. For example, at least one of the contact plugs CP may have an upper width at the upper interlayer insulating layer 136, and a lower width at the lower interlayer insulating layer 116 greater than the upper width.

Referring to FIG. 9, in an embodiment, at least one of the contact plugs CP may have a step between the boundary surface between the lower interlayer insulating layer 116 and the upper interlayer insulating layer 136. For example, at least one of the contact plugs CP may have an upper width at the upper interlayer insulating layer 136 and a lower width at the lower interlayer insulating layer 116 smaller than the upper width.

Figure 10:
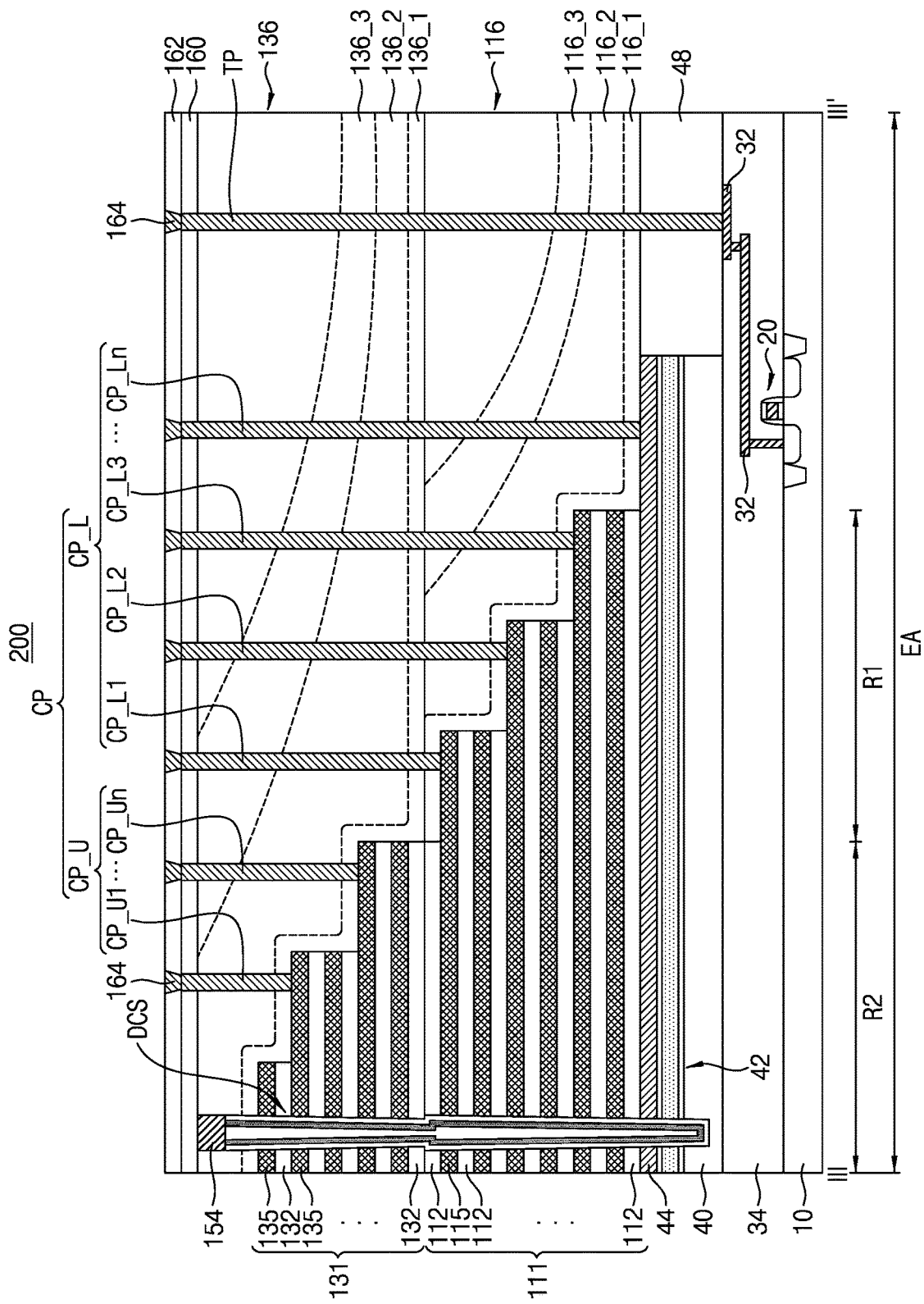
FIGS. 10 and 11 are vertical cross-sectional views taken along line of semiconductor devices according to example embodiments of the inventive concepts.
Figure 11:
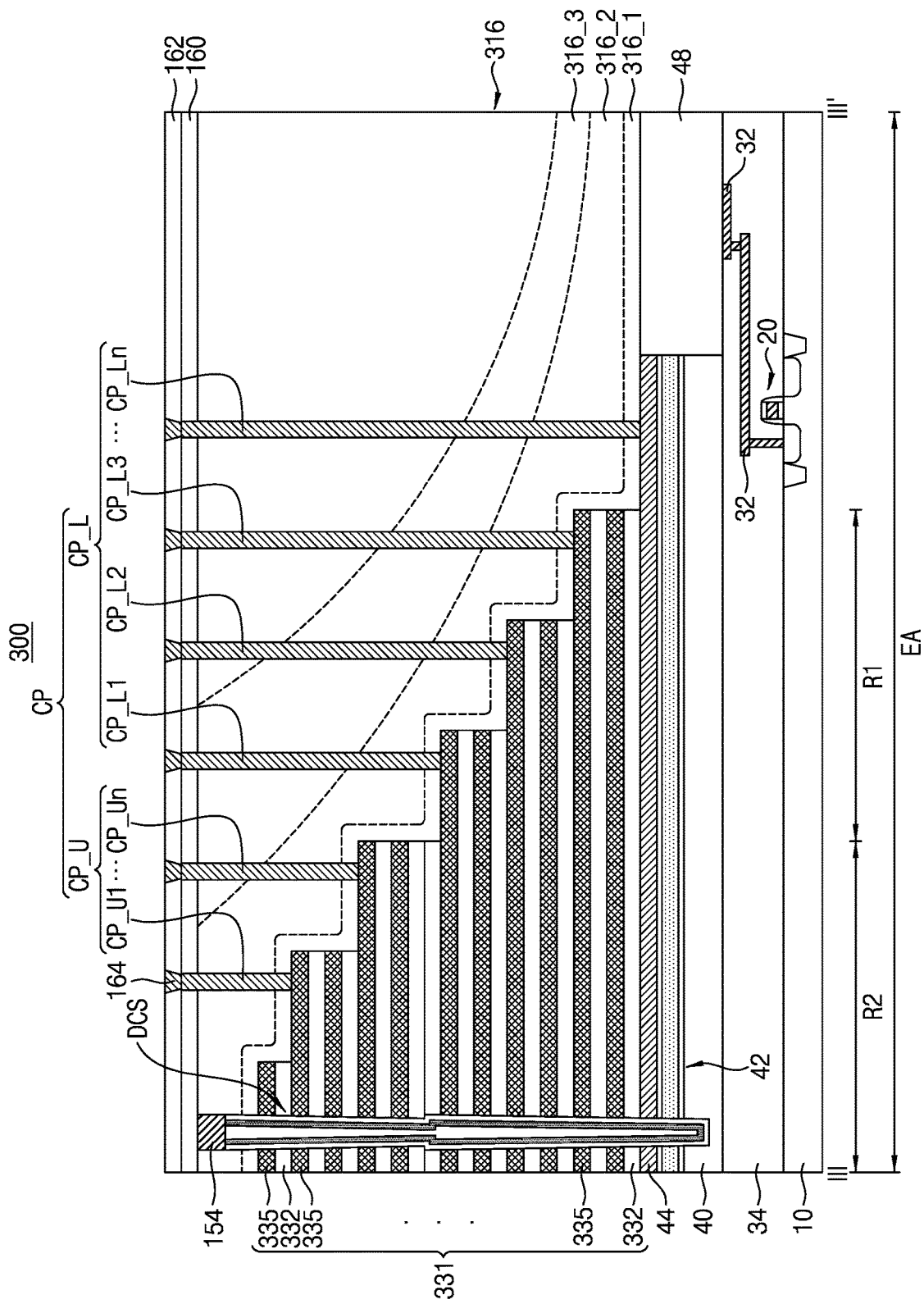

FIGS. 10 and 11 are vertical cross-sectional views taken along line III-III' of semiconductor devices according to example embodiments of the inventive concepts.

Referring to FIG. 10, a semiconductor device 200 may include a through plug TP. The through plug TP may extend through a buried insulating layer 48, a lower memory stack 111 and an upper memory stack 131, and may be electrically connected to a peripheral circuit structure PS. The through plug TP may be formed by anisotropically etching the buried insulating layer 48, the lower memory stack 111 and the upper memory stack 131, thereby forming a hole exposing a peripheral circuit wiring 32 of the peripheral circuit structure PS, and filling the hole with a conductive material. The doping concentration of the buried insulating layer 48 may be adjusted to increase the horizontal width of the through plug TP at a lower portion of the through plug TP. When the buried insulating layer 48 is deposited, impurities may be provided together with insulating materials constituting the buried insulating layer 48. For example, the doping concentration of the buried insulating layer 48 may be higher than the doping concentration of a lower interlayer insulating layer 116. The doping concentration of the buried insulating layer 48 may gradually increase as the buried insulating layer 48 extends downwards.

Referring to FIG. 11, a semiconductor device 300 may include a memory stack 331, and an interlayer insulating layer 316 covering the memory stack 331. The memory stack 331 may include insulating layers 332 and gate electrodes 335, which are alternately stacked. In an embodiment, the memory stack 331 may have a multi-stack structure. Of course, the exemplary embodiments of the disclosure are not limited to the above-described conditions. In an embodiment, the memory stack 331 may have a single stack structure.

The interlayer insulating layer 316 may cover a staircase structure of the memory stack 331, a supporter 44 and a buried insulating layer 48. The interlayer insulating layer 316 may form a single layer. A lower surface of the interlayer insulating layer 316 may be coplanar with a lower surface of the memory stack 331, whereas an upper surface of the interlayer insulating layer 316 may be coplanar with an upper surface of a channel structure CS. The interlayer insulating layer 316 may include a first doping region 316_1, a second doping region 316_2 and a third doping region 316_3, which are sequentially stacked. The first doping region 316_1 may extend along upper surfaces of the staircase structure of the memory stack 331, the supporter 44 and the buried insulating layer 48. Contact plugs CP may contact the first doping region 316_1. For example, a lower portion of each contact plug CP may contact the first doping region 316_1. The doping concentration of the interlayer insulating layer 316 may gradually increase as the interlayer insulating layer 316 becomes nearer to the staircase structure, the supporter 44 and the buried insulating layer 48.

FIGS. 12A to 23 are vertical cross-sectional views illustrating in process order of a method of manufacturing a semiconductor device shown in FIGS. 2 and 3. FIGS. 12A, 13A, 15A, 16A, 17A, 18A, 19A and 20A are vertical sectional views taken along lines I-I' and II-II' in FIG. 1. FIGS. 12B, 13B, 14, 15B, 16B, 17B, 18B, 19B, 20B, 21, 22 and 23 are vertical sectional views taken along line in FIG. 1.

Figure 12B:
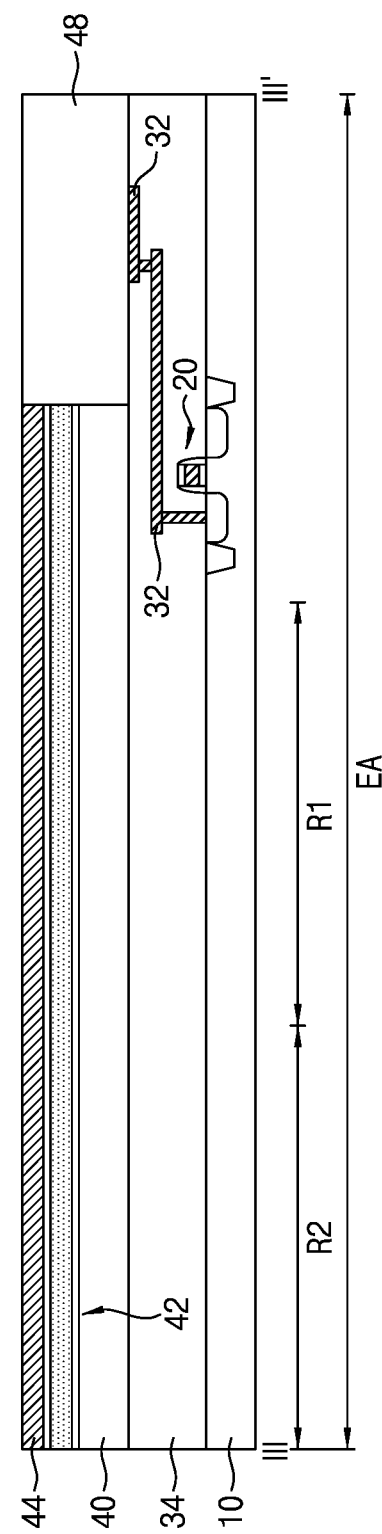

Referring to FIGS. 12A and 12B, a peripheral circuit structure PS, and a lower conductive layer 40, a connecting mold layer 42, a supporter 44, an electrode insulating layer 46 and a buried insulating layer 48 on the peripheral circuit structure PS may be formed. The peripheral circuit structure PS may include a substrate 10, a device isolation layer 12, an impurity region 14, a transistor 20, a peripheral contact plug 30, a peripheral circuit wiring 32, and a peripheral insulating layer 34. The device isolation layer 12 and the impurity region 14 may be formed at an upper surface of the substrate 10. In an embodiment, the device isolation layer 12 may include or may be formed of an insulating material such as silicon oxide and silicon nitride. The impurity region 14 may include or may be doped with an n-type impurity or a p-type impurity. The transistor 20 may be disposed adjacent to the impurity region 14. The peripheral circuit wiring 32 may be disposed on the peripheral contact plug 30, and may be connected to the impurity region 14 through the peripheral contact plug 30. The peripheral insulating layer 34 may cover the transistor 20, the peripheral contact plug 30 and the peripheral circuit wiring 32.

The lower conductive layer 40 may be disposed on the peripheral circuit structure PS. The connecting mold layer 42 may be disposed on the lower conductive layer 40. The connecting mold layer 42 may be partially etched such that the lower conductive layer 40 is exposed in an extension area EA. The connecting mold layer 42 may include a passivation layer, and insulating layers respectively disposed at upper and lower surfaces of the passivation layer.

The lower conductive layer 40 may include or may be formed of metal, metal nitride, metal silicide, metal oxide, conductive carbon, polysilicon, or a combination thereof. In an embodiment, the lower conductive layer 40 may include or may be formed of a doped polysilicon layer. The connecting mold layer 42 may include or may be formed of a material having etch selectivity with respect to the lower conductive layer 40. The insulating layers may include or may be formed of a material having etch selectivity with respect to the passivation layer. In an embodiment, the insulating layers may include or may be formed of silicon oxide, and the passivation layer may include silicon nitride. In an embodiment, the supporter 44 may include or may be formed of polysilicon.

The supporter 44 may be deposited on the connecting mold layer 42. In a cell array area CA, the supporter 44 may cover the connecting mold layer 42. In the extension area EA, the supporter 44 may cover the lower conductive layer 40 and the connecting mold layer 42.

The electrode insulating layer 46 may be formed in a through electrode area TA, and the buried insulating layer 48 may be formed in the extension area EA. The electrode insulating layer 46 and the buried insulating layer 48 may be formed by etching the lower conductive layer 40 and the supporter 44 such that the peripheral circuit wiring 32 and the peripheral insulating layer 34 are exposed, and depositing an insulating material on the resultant structure. In an embodiment, the electrode insulating layer 46 and the buried insulating layer 48 may include or may be formed of silicon oxide, silicon nitride, silicon oxynitride, low-k dielectrics, high-k dielectrics, or a combination thereof. In an embodiment, the electrode insulating layer 46 and the buried insulating layer 48 may include or may be formed of silicon oxide.

Figure 13B:
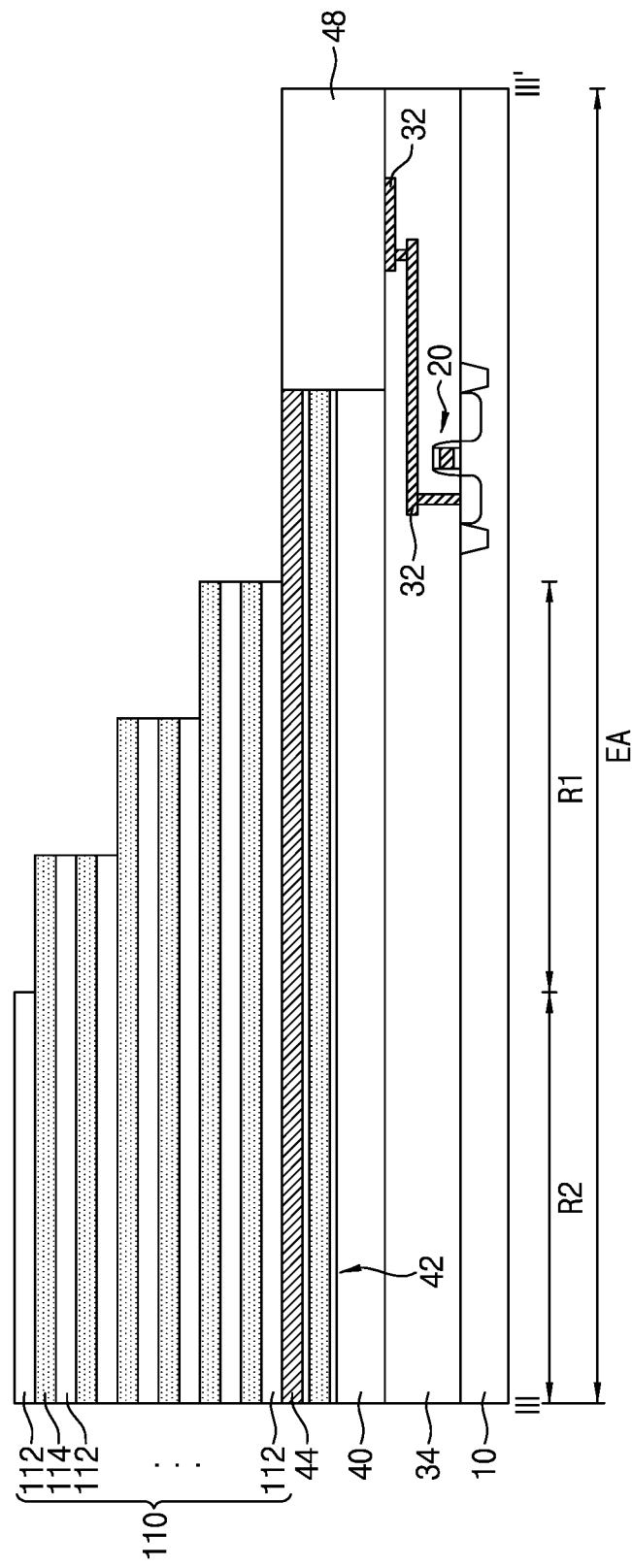

Referring to FIGS. 13A and 13B, a lower mold stack 110 may be formed on the resultant structure of FIGS. 12A and 12B. The lower mold stack 110 may include lower insulating layers 112 and lower mold layers 114, which are alternately stacked. The lower insulating layers 112 and the lower mold layers 114 may be formed through a chemical vapor deposition (CVD) process or an atomic layer deposition (ALD) process. The lower insulating layers 112 may include or may be formed of a material having etch selectivity with respect to the lower mold layers 114. In an embodiment, the lower insulating layers 112 may include or may be formed of silicon oxide, and the lower mold layers 114 may include or may be formed of silicon nitride.

The lower mold stack 110 may be trimmed to have a lower staircase structure in the extension area EA (for example, corresponding to an area designated by "R1" in FIG. 13B). The lower staircase structure may represent a structure having a staircase shape while extending from an end of the lower mold stack 110.

Figure 14:
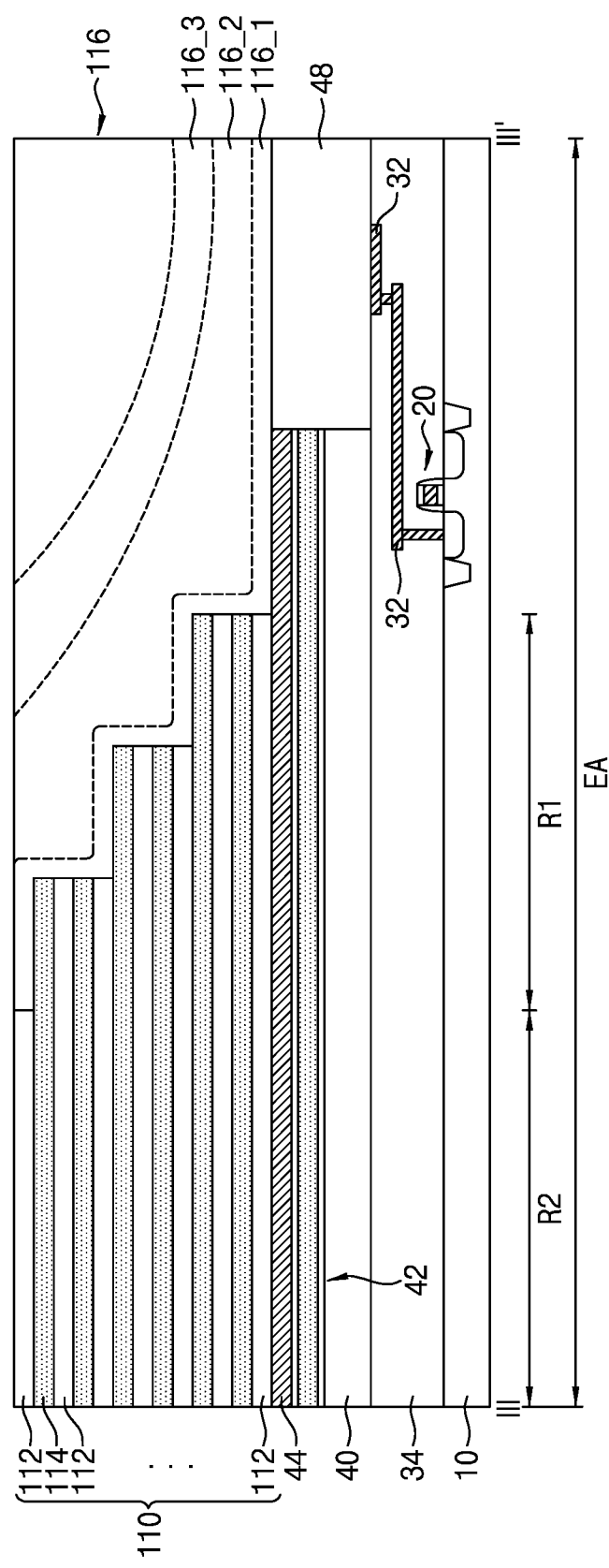

Referring to FIG. 14, a lower interlayer insulating layer 116 may be formed to cover the lower staircase structure of the lower mold stack 110. The lower interlayer insulating layer 116 may be formed by stacking an interlayer insulating material on the supporter 44, the buried insulating layer 48 and the lower mold stack 110 shown in FIG. 13B, and performing a planarization process such that upper surfaces of the interlayer insulating material and the lower mold stack 110 become coplanar. The lower interlayer insulating layer 116 may be formed using tetraethyl orthosilicate (TEOS). In a deposition process of the lower interlayer insulating layer 116, a chemical vapor deposition process, a plasma enhanced chemical vapor deposition (PECVD) process or an atomic layer deposition process may be used. The lower interlayer insulating layer 116 may include or may be formed of silicon oxide.

In an embodiment, the lower interlayer insulating layer 116 may be doped with an impurity. For example, the lower interlayer insulating layer 116 may include or may be doped with the impurity such as boron (B), phosphorous (P), fluorine (F), and a combination thereof. The impurity may be provided together with TEOS in a deposition process and, as such, a first lower doping region 116_1, a second lower doping region 116_2 and a third lower doping region 116_3 having different doping concentrations may be sequentially formed. In an embodiment, the doping concentration of the lower interlayer insulating layer 116 may gradually increase as the lower interlayer insulating layer 116 extends downwards. For example, the doping concentration of the first lower doping region 116_1 may be higher than the doping concentration of the second lower doping region 116_2, and the doping concentration of the second lower doping region 116_2 may be higher than the doping concentration of the third lower doping region 116_3.

Figure 15B:
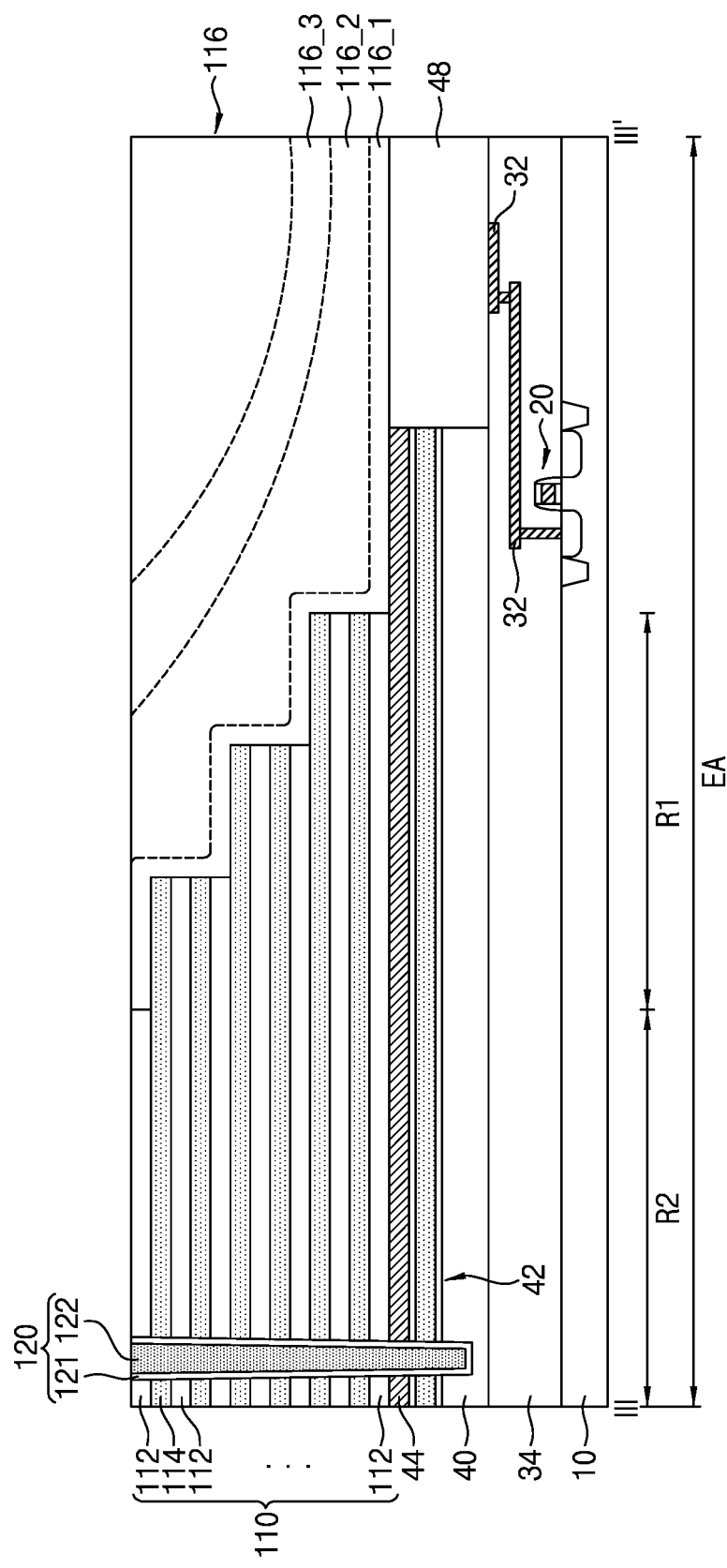

Referring to FIGS. 15A and 15B, channel sacrificial layers 120 may be formed in the cell array area CA and the extension area EA. Each channel sacrificial layer 120 may be formed by vertically etching the lower mold stack 110, thereby forming a channel hole, and depositing a sacrificial material in the channel hole. Each channel sacrificial layer 120 may include a first sacrificial material 121 and a second sacrificial material 122. The first sacrificial material 121 may be conformally formed along an inner surface of the channel hole, and the second sacrificial material 122 may fill an inside of the first sacrificial material 121. In an embodiment, the first sacrificial material 121 may include or may be formed of silicon nitride, and the second sacrificial material 122 may include or may be formed of polysilicon. After formation of the channel sacrificial layers 120, a planarization process may be further performed such that an upper surface of each channel sacrificial layer 120 is coplanar with the upper surface of the lower mold stack 110.

Figure 16B:
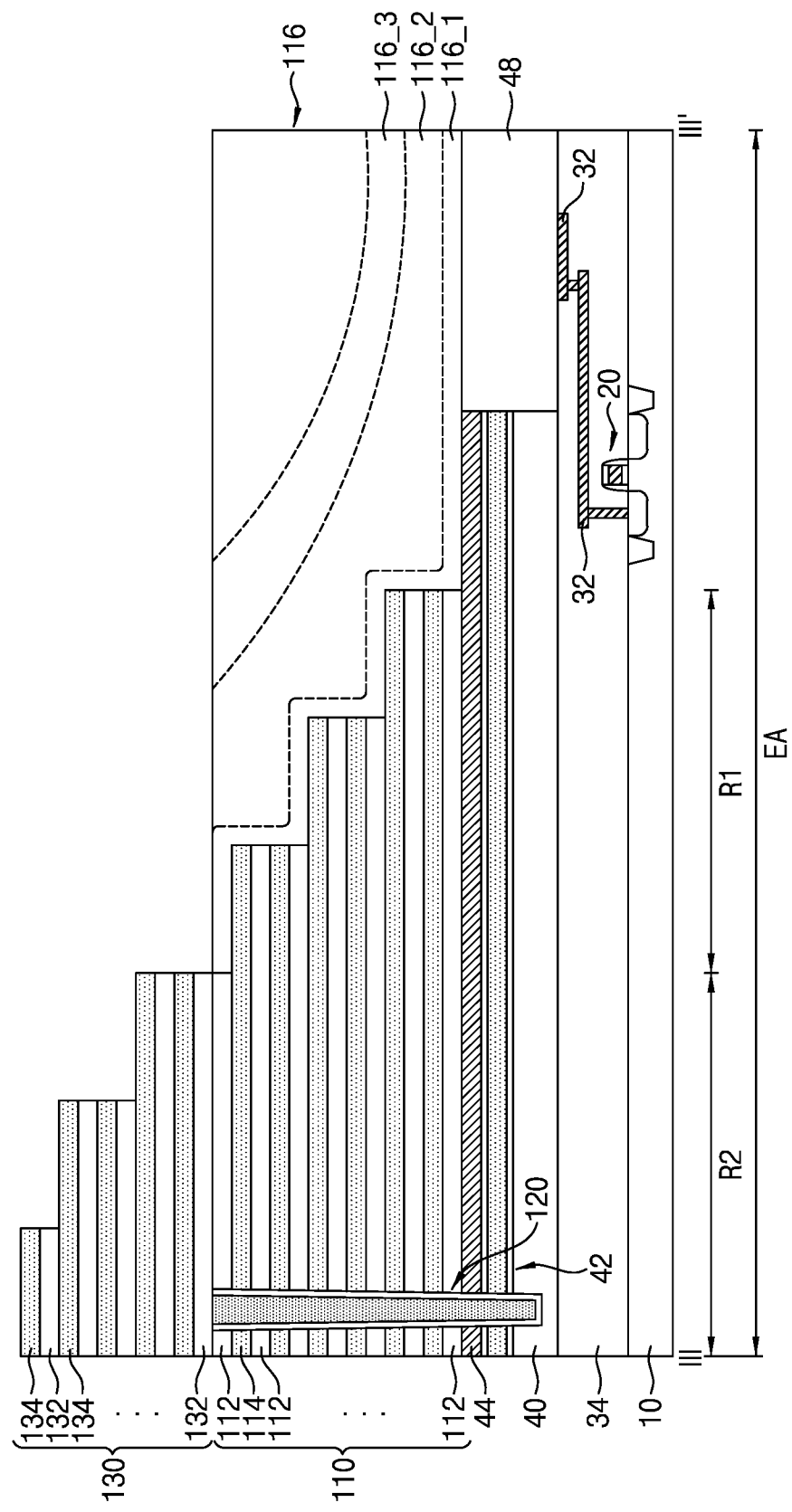

Referring to FIGS. 16A and 16B, an upper mold stack 130 may be formed on the resultant structure of FIGS. 15A and 15B. The upper mold stack 130 may include upper insulating layers 132 and upper mold layers 134, which are alternately stacked. The upper insulating layers 132 and the upper mold layers 134 may be formed through a chemical vapor deposition process or an atomic layer deposition process. The upper insulating layers 132 may include or may be formed of a material having etch selectivity with respect to the upper mold layers 134. In an embodiment, the upper insulating layers 132 may include or may be formed of silicon oxide, and the upper mold layers 134 may include or may be formed of silicon nitride.

The upper mold stack 130 may be trimmed to have an upper staircase structure in the extension area EA (for example, corresponding to an area designated by "R2" in FIG. 16B). The upper staircase structure may represent a structure having a staircase shape while extending from an end of the upper mold stack 130.

Figure 17B:
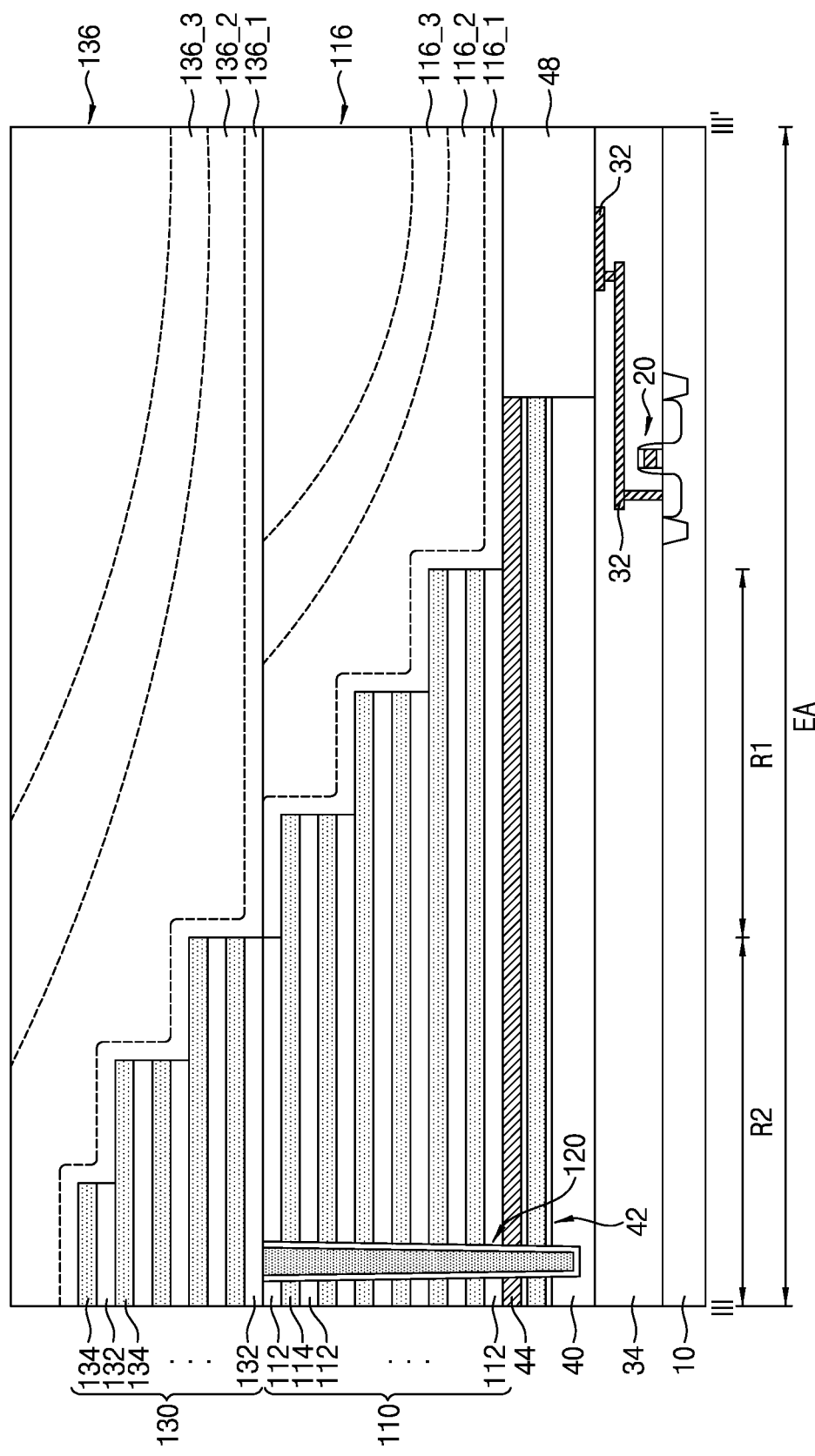

Referring to FIGS. 17A and 17B, an upper interlayer insulating layer 136 may be formed to cover the upper staircase structure of the upper mold stack 130. The upper interlayer insulating layer 136 may be formed by stacking an interlayer insulating material on the lower interlayer insulating layer 116 and the upper mold stack 130 shown in FIG. 16B, and performing a planarization process such that upper surfaces of the interlayer insulating material and the upper mold stack 130 become coplanar. The upper interlayer insulating layer 136 may be formed using TEOS, and the process of forming the upper interlayer insulating layer 136 may be similar to the process of forming the lower interlayer insulating layer 116. The upper interlayer insulating layer 136 may include or may be formed of silicon oxide.

In an embodiment, the upper interlayer insulating layer 136 may be doped with an impurity. For example, the upper interlayer insulating layer 136 may include or may be formed of silicon oxide and may include or may be doped with the impurity such as boron (B), phosphorous (P), fluorine (F), and a combination thereof. The impurity may be provided together with TEOS in a deposition process and, as such, a first upper doping region 136_1, a second upper doping region 136_2 and a third upper doping region 136_3 having different doping concentrations may be sequentially formed. In an embodiment, the doping concentration of the upper interlayer insulating layer 136 may gradually increase as the upper interlayer insulating layer 136 extends downwards. For example, the doping concentration of the first upper doping region 136_1 may be higher than the doping concentration of the second upper doping region 136_2, and the doping concentration of the second upper doping region 136_2 may be higher than the doping concentration of the third upper doping region 136_3.

Figure 18A:
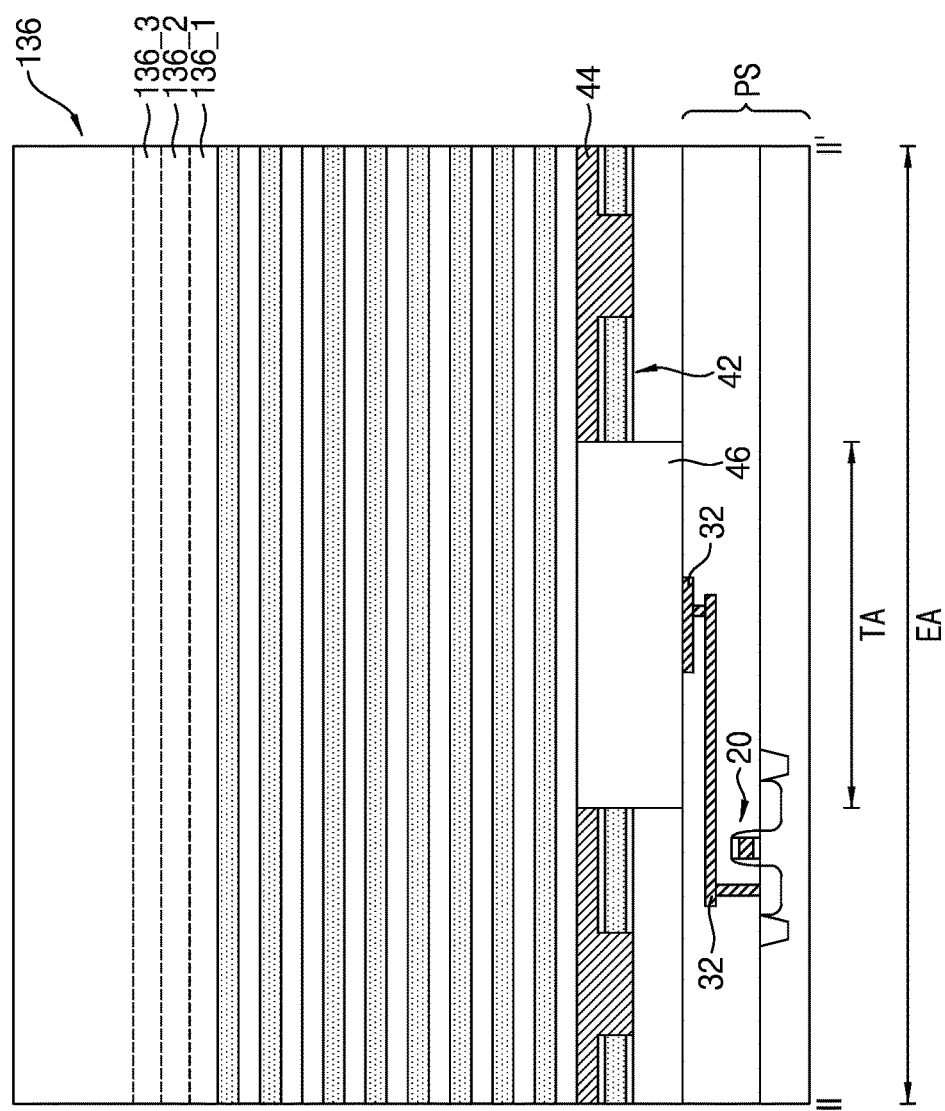
Figure 18B:
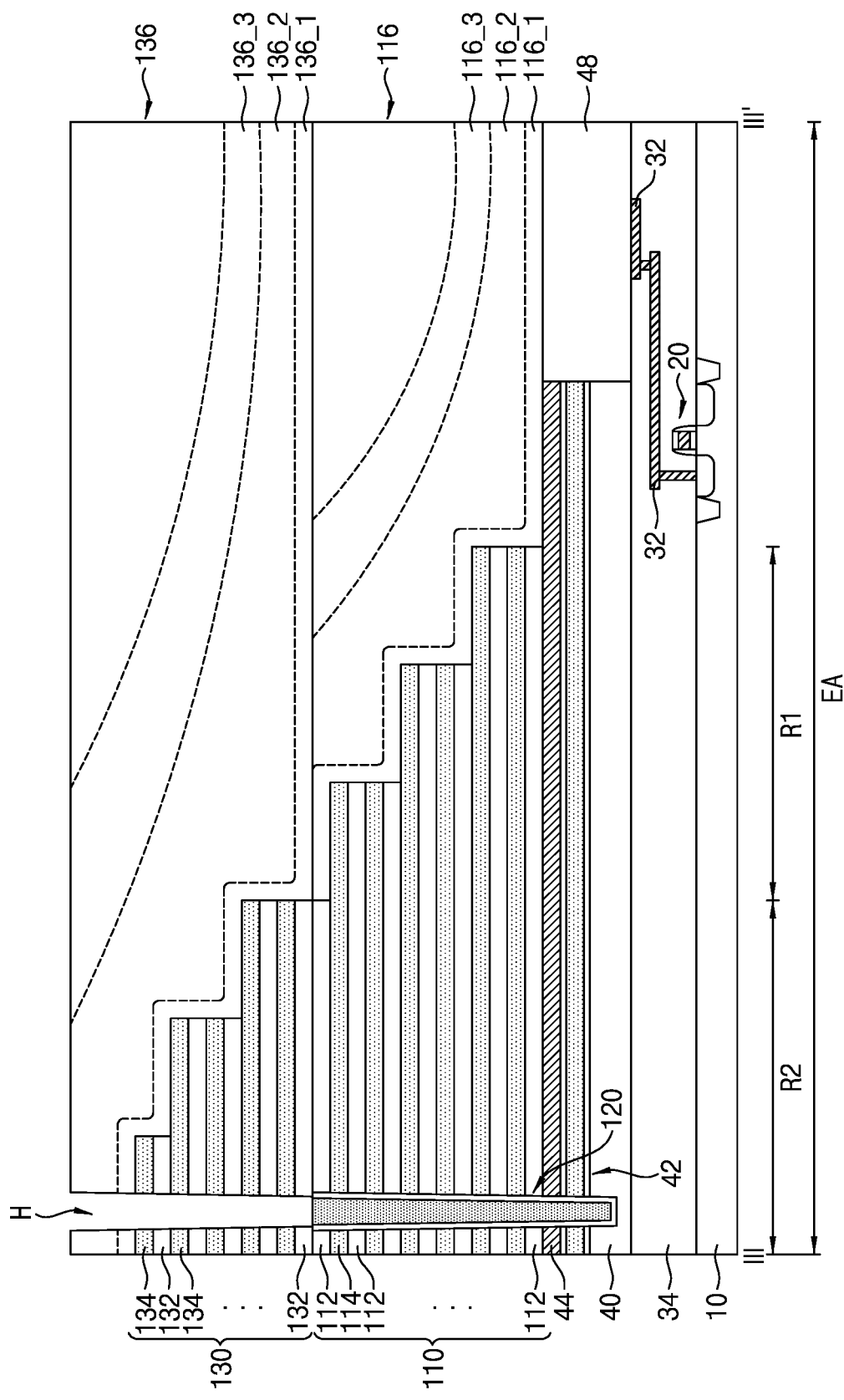

Referring to FIGS. 18A and 18B, channel holes H may be formed at the upper mold stack 130 and the upper interlayer insulating layer 136. The channel holes H may be formed by anisotropically etching the upper mold stack 130 and the upper interlayer insulating layer 136. Each channel hole H may extend vertically through the upper mold stack 130, thereby exposing a corresponding one of the channel sacrificial layers 120.

Figure 19A:
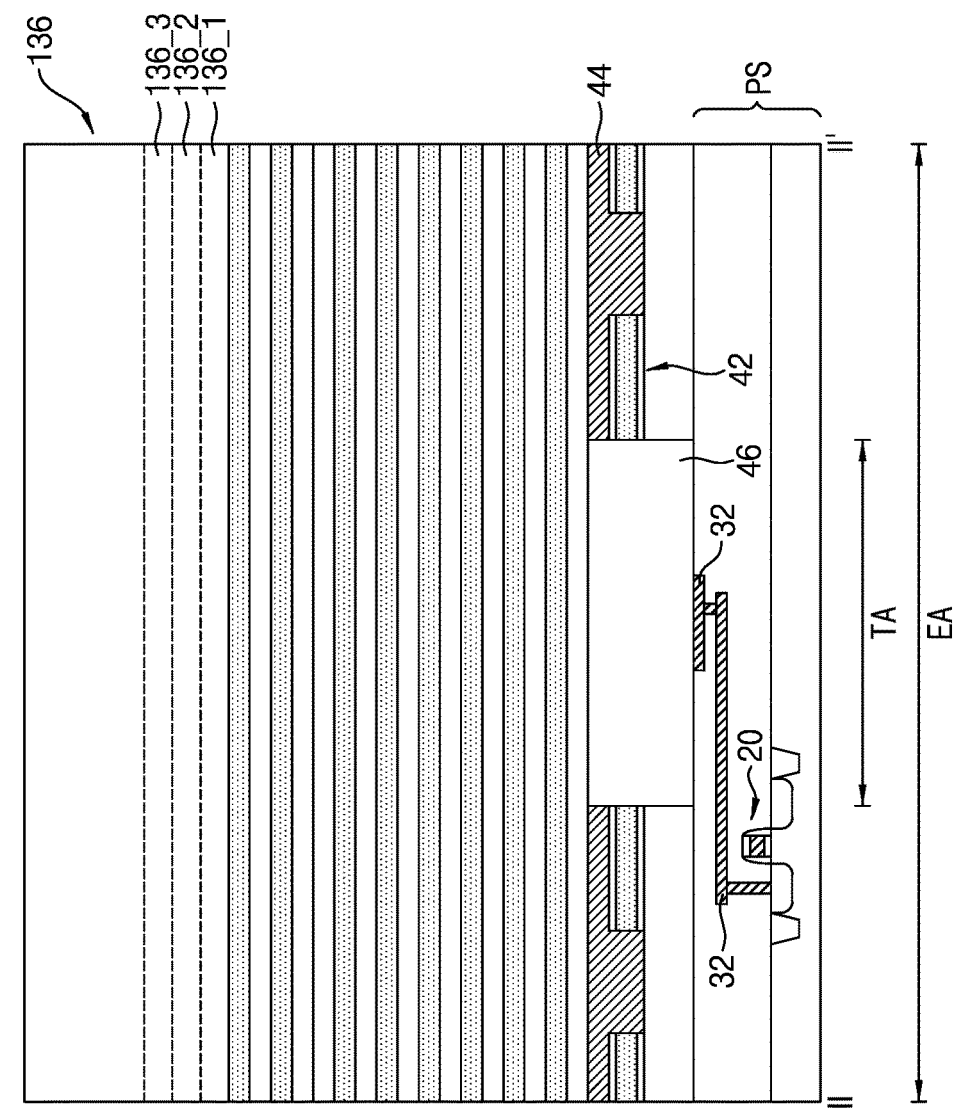

Referring to FIGS. 19A and 19B, the channel sacrificial layers 120 may be removed, and channel structures CS and dummy channel structures DCS may then be formed. Removal of the channel sacrificial layers 120 may include forming a sacrificial material in the channel holes H. The sacrificial material may include or may be formed of the same material as the first sacrificial material 121 and the second sacrificial material 122.

The channel structures CS and the dummy channel structures DCS may be formed in the channel holes H, respectively. The channel structures CS may be formed by depositing an information storage layer 140, a channel layer 150 and a buried insulating pattern 152 in the channel holes H in the cell array area CA. The dummy channel structures DCS may have substantially the same structure as the channel structures CS. The dummy channel structures DCS may extend through the connecting mold layer 42, the supporter 44, the mold stacks 110 and 130, and the interlayer insulating layers 116 and 136 in the extension area EA.

Conductive pads 154 may be formed on the channel structures CS and the dummy channel structures DCS, respectively. Each conductive pad 154 may include or may be formed of a conductive layer made of metal, metal nitride, metal oxide, metal silicide, conductive carbon, polysilicon, or a combination thereof.

Figure 20A:
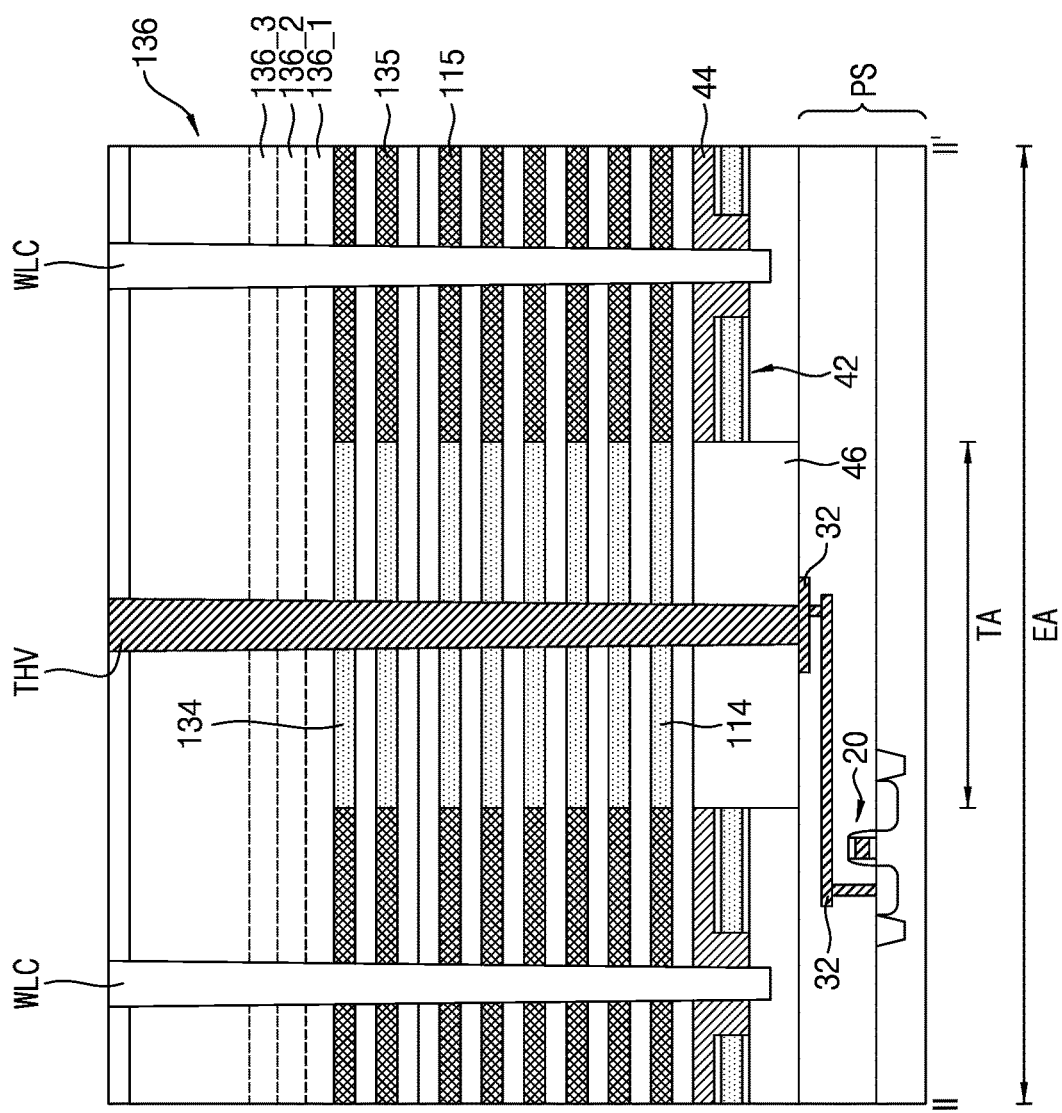
Figure 20B:
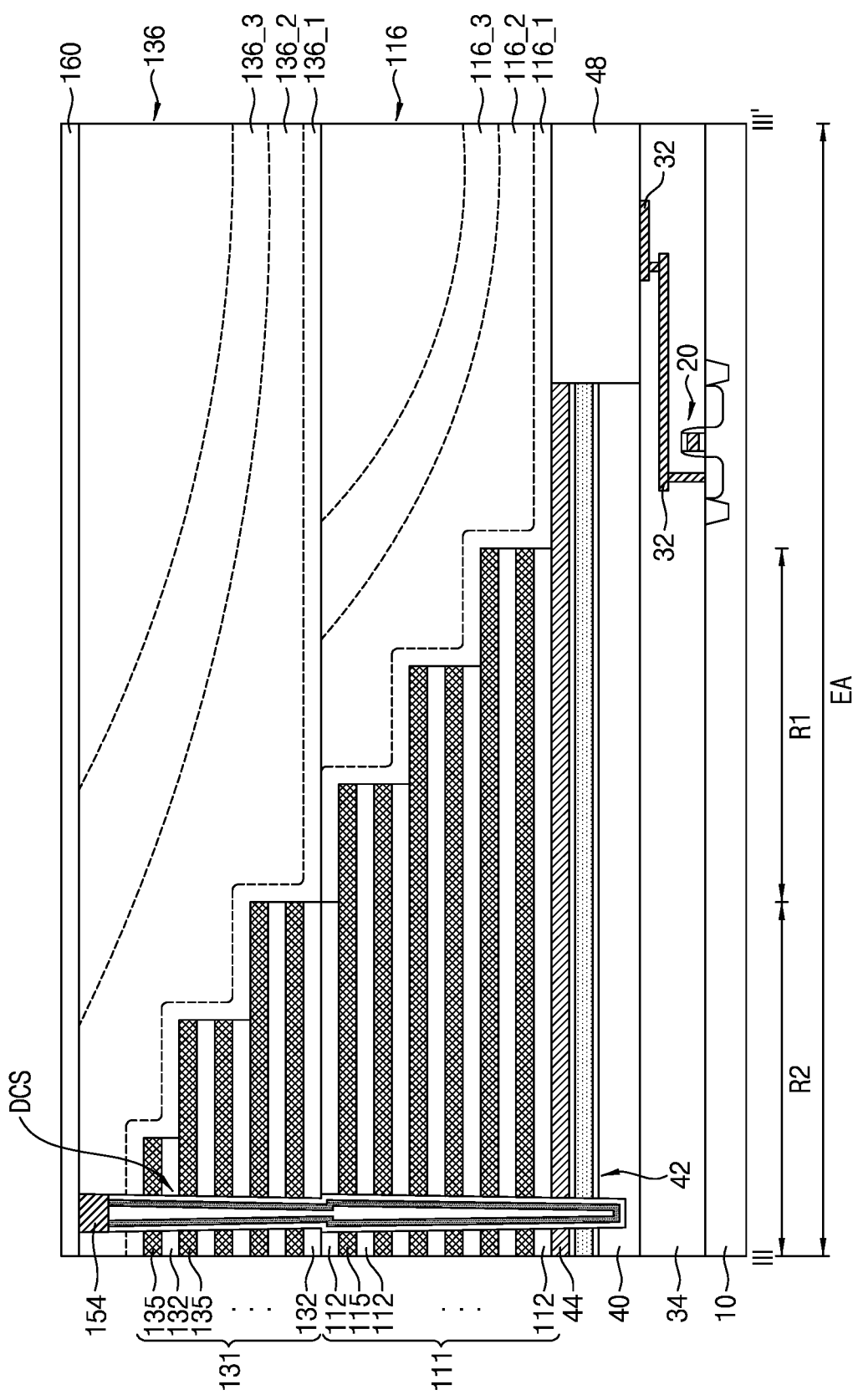

Referring to FIGS. 20A and 20B, a first upper insulating layer 160 may be deposited on the resultant structure of FIGS. 19A and 19B, and a connecting conductive layer 43 may be substituted for the connecting mold layer 42. The first upper insulating layer 160 may be disposed on the upper mold stack 130, and may include or may be formed of silicon oxide, silicon nitride, silicon oxynitride, or a combination thereof. Formation of the connecting conductive layer 43 may include forming an isolation trench at a position where an isolation insulating layer WLC will be formed, selectively etching the connecting mold layer 42 exposed by the isolation trench, thereby exposing a side surface of each channel structure CS, and filling a space formed through selective etching of the connecting mold layer 42 with a conductive material such that the conductive material contacts the channel structure CS. The isolation trench may be formed through an anisotropic etching process. The isolation trench may extend through the lower mold stack 110 and the upper mold stack 130, thereby exposing the connecting mold layer 42. Etching of the connecting mold layer 42 may be performed by using an isotropic etching process. The connecting conductive layer 43 may include or may be formed of metal, metal nitride, metal oxide, metal silicide, polysilicon, conductive carbon, or a combination thereof. In an embodiment, the connecting conductive layer 43 may include or may be formed of polysilicon. During a process of etching the connecting mold layer 42, a spacer may be further formed at a side surface of the isolation trench in order to prevent the lower mold stack 110 and the upper mold stack 130 from being etched.

After formation of the connecting conductive layer 43, lower gate electrodes 115 and upper gate electrodes 135 may be substituted for the lower mold layers 114 and the upper mold layers 134, respectively. Formation of the lower gate electrodes 115 and the upper gate electrodes 135 may include removing the spacer after formation of the connecting conductive layer 43, thereby exposing the lower mold layers 114 and the upper mold layers 134, isotropically etching the lower mold layers 114 and the upper mold layers 134, and filling a conductive material among the lower insulating layers 112 and among the upper insulating layers 132. The lower mold layers 114 and the upper mold layers 134 may not be removed from the through electrode area TA.

The lower gate electrodes 115 and the upper gate electrodes 135 may be formed in spaces from which the lower mold layers 114 and the upper mold layers 134 have been removed, respectively. After formation of the lower gate electrodes 115 and the upper gate electrodes 135, an anisotropic etching process may be further performed along the isolation trench. The lower gate electrodes 115 may be disposed to alternate with the lower insulating layers 112 and, as such, may constitute a lower memory stack 111. The upper gate electrodes 135 may be disposed to alternate with the upper insulating layers 132 and, as such, may constitute an upper memory stack 131. In an embodiment, the lower gate electrodes 115 and the upper gate electrodes 135 may include or may be formed of tungsten.

A through electrode THV may be formed in the through electrode area TA. The through electrode THV may be formed by anisotropically etching the electrode insulating layer 46, the lower memory stack 111, the upper memory stack 131 and the upper interlayer insulating layer 136, thereby forming a through hole, and filling the through hole with a conductive material. The through electrode THV may be electrically connected to the peripheral circuit structure PS while being electrically insulated from the lower gate electrodes 115 and the upper gate electrodes 135. For example, the through electrode THV may contact the peripheral circuit wiring 32 at a lower surface thereof while contacting the lower mold layers 114 and the upper mold layers 134 at a side surface thereof. The through electrode THV may include or may be formed of metal, metal nitride, metal oxide, metal silicide, polysilicon, conductive carbon, or a combination thereof.

Figure 21:
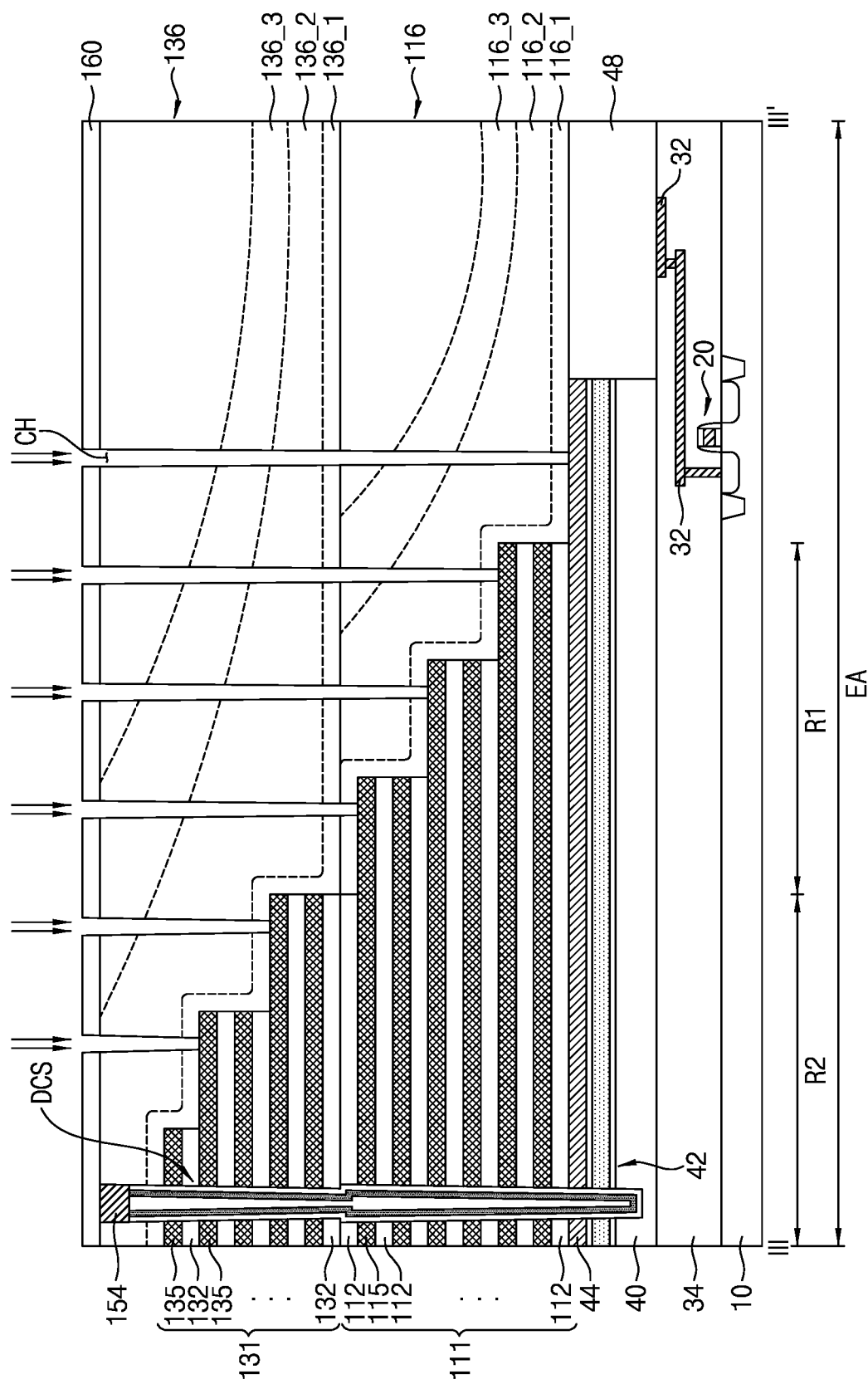

Referring to FIG. 21, contact holes CH may be formed by etching the lower interlayer insulating layer 116, the upper interlayer insulating layer 136 and the first upper insulating layer 160. Each contact hole CH may expose a corresponding one of the lower gate electrodes 115 and the upper gate electrodes 135. At least one of the contact holes CH may expose the supporter 44. The contact holes CH may be formed through an anisotropic etching process. For example, a dry etching process may be used. As shown in FIG. 21, the contact holes CH, which are formed to extend vertically from an upper surface of the first upper insulating layer 160, may have a non-uniform horizontal width. In an embodiment, the contact holes CH may have a tapered shape in which the horizontal width of each contact hole CH is gradually reduced as the contact hole CH extends downwards. For example, the contact holes CH may have the same horizontal width at upper ends thereof, but those having greater lengths from among the contact holes CH may have reduced horizontal widths at lower ends thereof.

Figure 22:
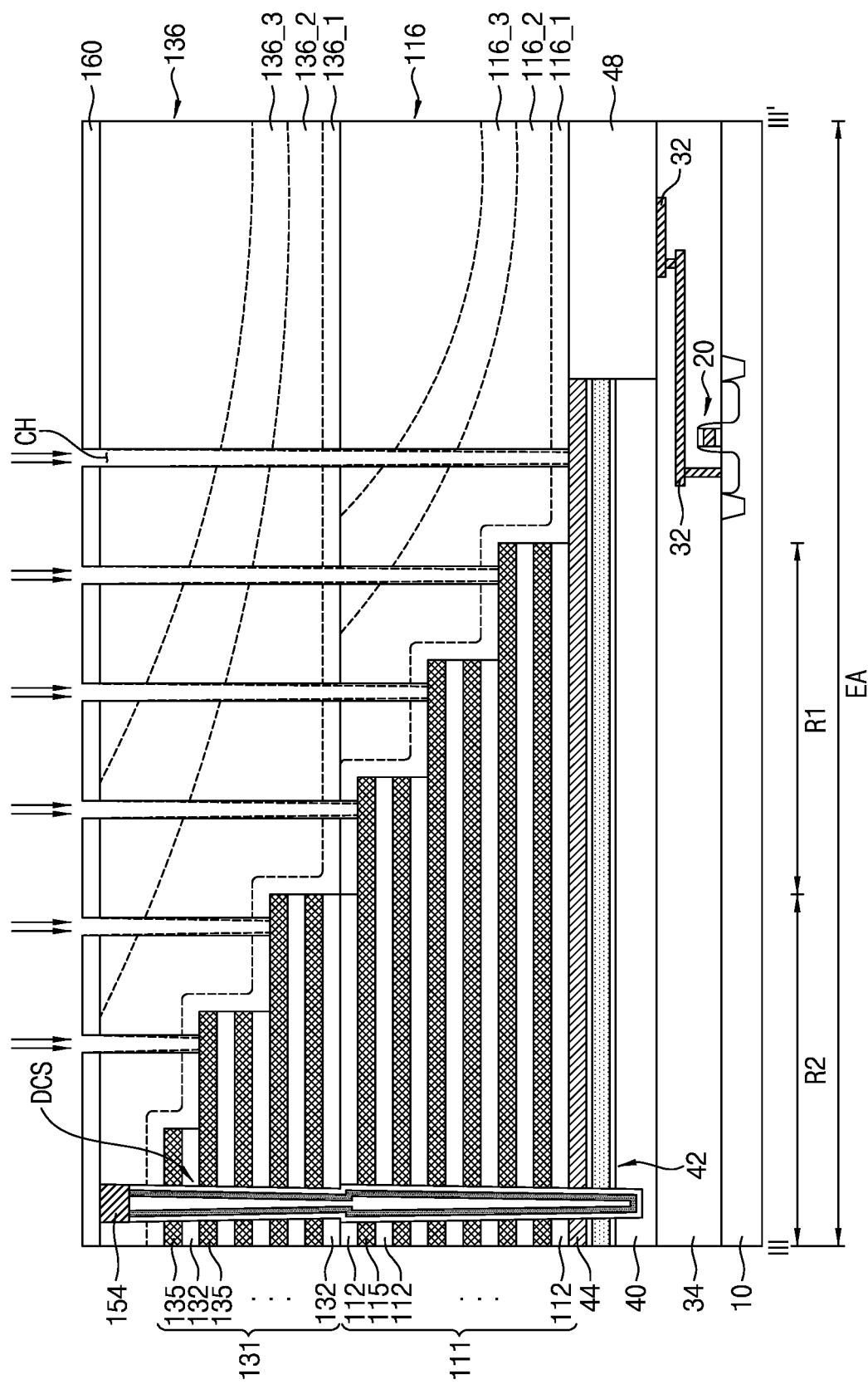

Referring to FIG. 22, an etching process for etching the lower interlayer insulating layer 116 and the upper interlayer insulating layer 136 may be further performed. The etching process may be an isotropic etching process such as a wet etching process. In accordance with the wet etching process, the horizontal width of each contact hole CH may be increased. Each of the lower interlayer insulating layer 116 and the upper interlayer insulating layer 136 may have different doping concentrations in accordance with vertical levels thereof, and may exhibit different etching amounts in accordance with different doping concentrations. For example, at a higher doping concentration, a higher etching rate may be exhibited in a wet etching process. As described with reference to FIGS. 15B and 17B, the lower interlayer insulating layer 116 and the upper interlayer insulating layer 136 may have a doping concentration gradually increasing as the lower interlayer insulating layer 116 and the upper interlayer insulating layer 136 extend downwards. As such, in a wet etching process, each of the lower interlayer insulating layer 116 and the upper interlayer insulating layer 136 may be further etched at a lower portion thereof than at an upper portion thereof.

As shown in FIG. 21, the contact holes CH may have a tapered shape and, as such, the first lower doping region 116_1 may have the highest doping concentration in order to uniformize the horizontal width of each contact hole CH. In an embodiment, the doping concentration of the first upper doping region 136_1 may be lower than the doping concentration of the first lower doping region 116_1.

It may be possible to reduce a horizontal width difference between the upper end and the lower end of each contact hole CH by forming the lower interlayer insulating layer 116 and the upper interlayer insulating layer 136 such that each of the lower interlayer insulating layer 116 and the upper interlayer insulating layer 136 has different doping concentrations in accordance with different vertical levels thereof, and further performing a wet etching process after execution of a dry etching process, as described above. In addition, as the horizontal width of each contact hole CH increases, it may be possible to reduce the resistance of the contact hole CH and to reduce occurrence of a situation in which the lower gate electrodes 115 or the upper gate electrodes 135 are not exposed. Accordingly, reliability of the resultant device may be enhanced.

Figure 23:
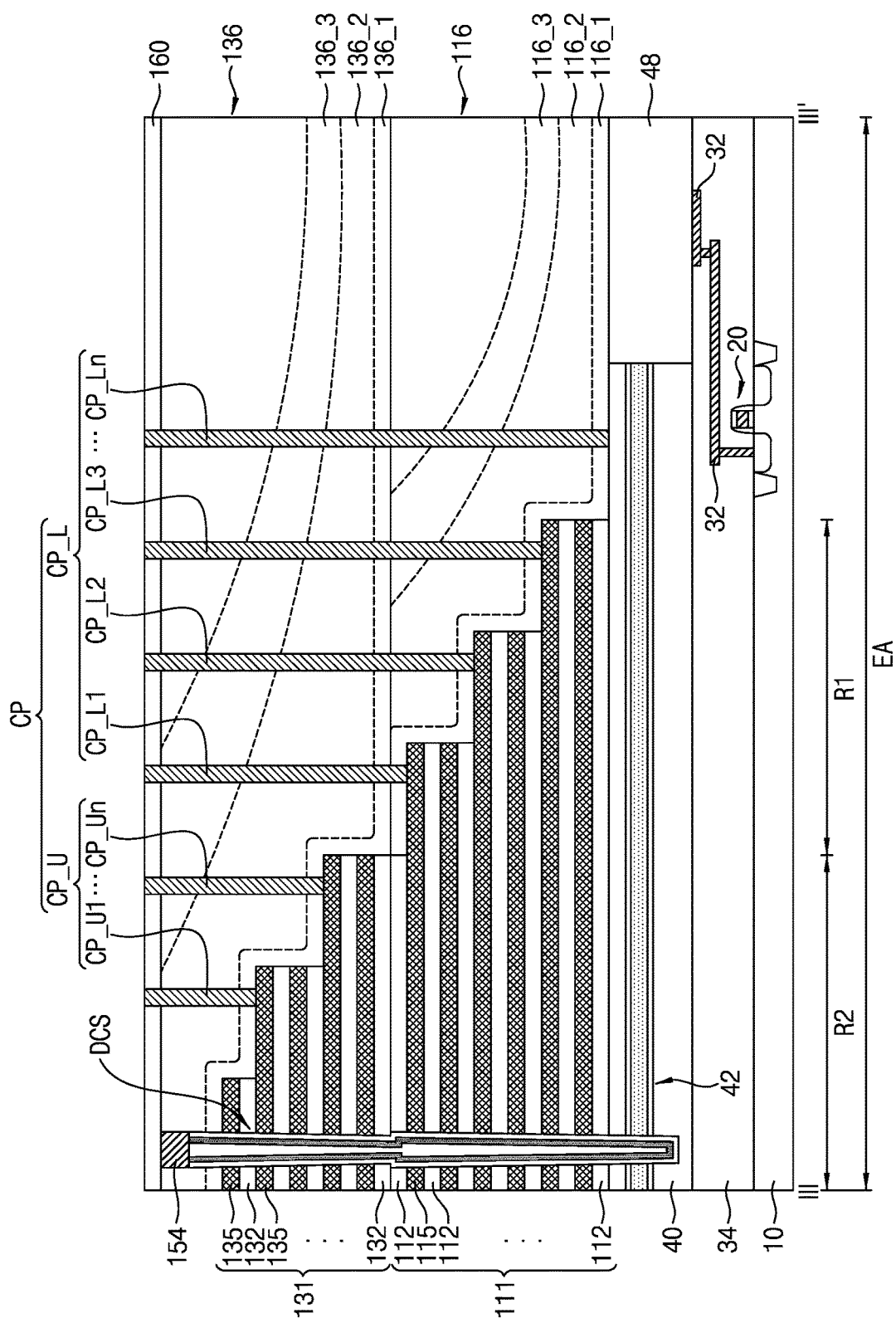

Referring to FIG. 23, contact plugs CP may be formed by depositing a conductive material in the contact holes CH. The contact plugs CP may include lower contact plugs CP_L contacting respective lower gate electrodes 115, and upper contact plugs CP_U contacting respective upper gate electrodes 135. At least one of the lower contact plugs CP_L may contact the supporter 44. In an embodiment, the horizontal width of each contact plug CP may be substantially uniform without varying in accordance with a vertical level of the contact plug CP.

Again referring to FIGS. 2 and 3, a second upper insulating layer 162 and studs 164 may be formed. The second upper insulating layer 162 may be formed on the first upper insulating layer 160. The studs 164 may contact the channel structures CS, the through electrode THV and the contact plugs CP while extending through the second upper insulating layer 162, respectively. However, the studs 164 may not contact the dummy channel structures DCS.

The second upper insulating layer 162 may include or may be formed of silicon oxide, silicon nitride, silicon oxynitride, or a combination thereof. The studs 164 may include or may be formed of metal, metal nitride, metal oxide, metal silicide, polysilicon, conductive carbon, or a combination thereof.

Figure 24:
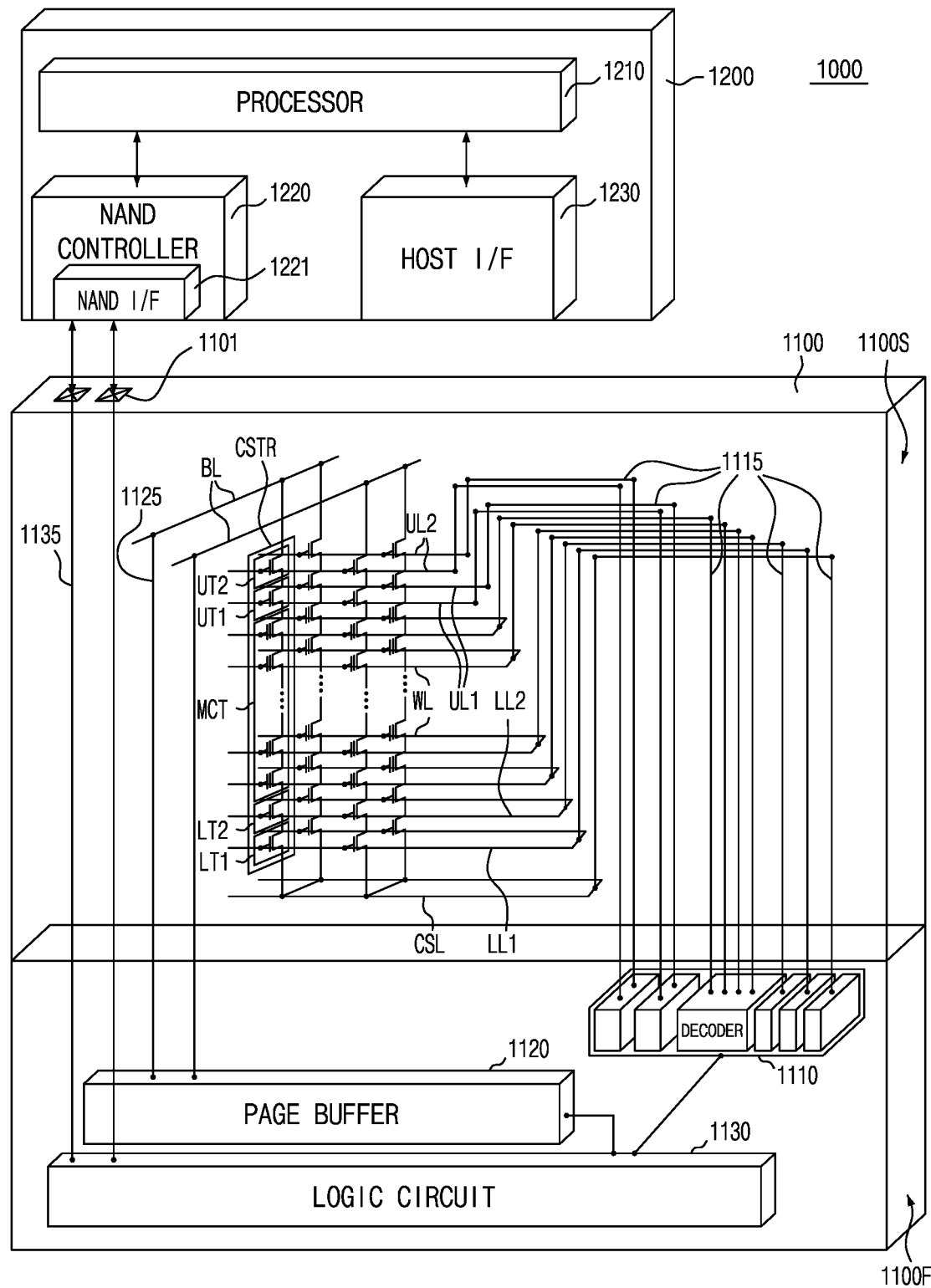
FIG. 24 is a schematic diagram of an electronic system including a semiconductor device according to an example embodiment of the inventive concepts.

FIG. 24 is a schematic diagram of an electronic system including a semiconductor device according to an example embodiment of the inventive concepts.

Referring to FIG. 24, an electronic system 1000 according to an exemplary embodiment of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD), a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may be a NAND flash memory device described with reference to FIGS. 1 to 4. The semiconductor device 1100 may include a first structure 1110F, and a second structure 1100S on the first structure 1110F. In exemplary embodiments, the first structure 1110F may be disposed at one side of the second structure 1100S. The first structure 1110F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In exemplary embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 via first connecting lines 1115 extending from the first structure 1110F to the second structure 1100S. The bit lines BL may be electrically connected to the page buffer 1120 via second connecting lines 1125 extending from the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through input/output pads 1101 electrically connected to the logic circuit 1130. The input/output pads 1101 may be electrically connected to the logic circuit 1130 via input/output connecting lines 1135 extending from the first structure 1110F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 25:
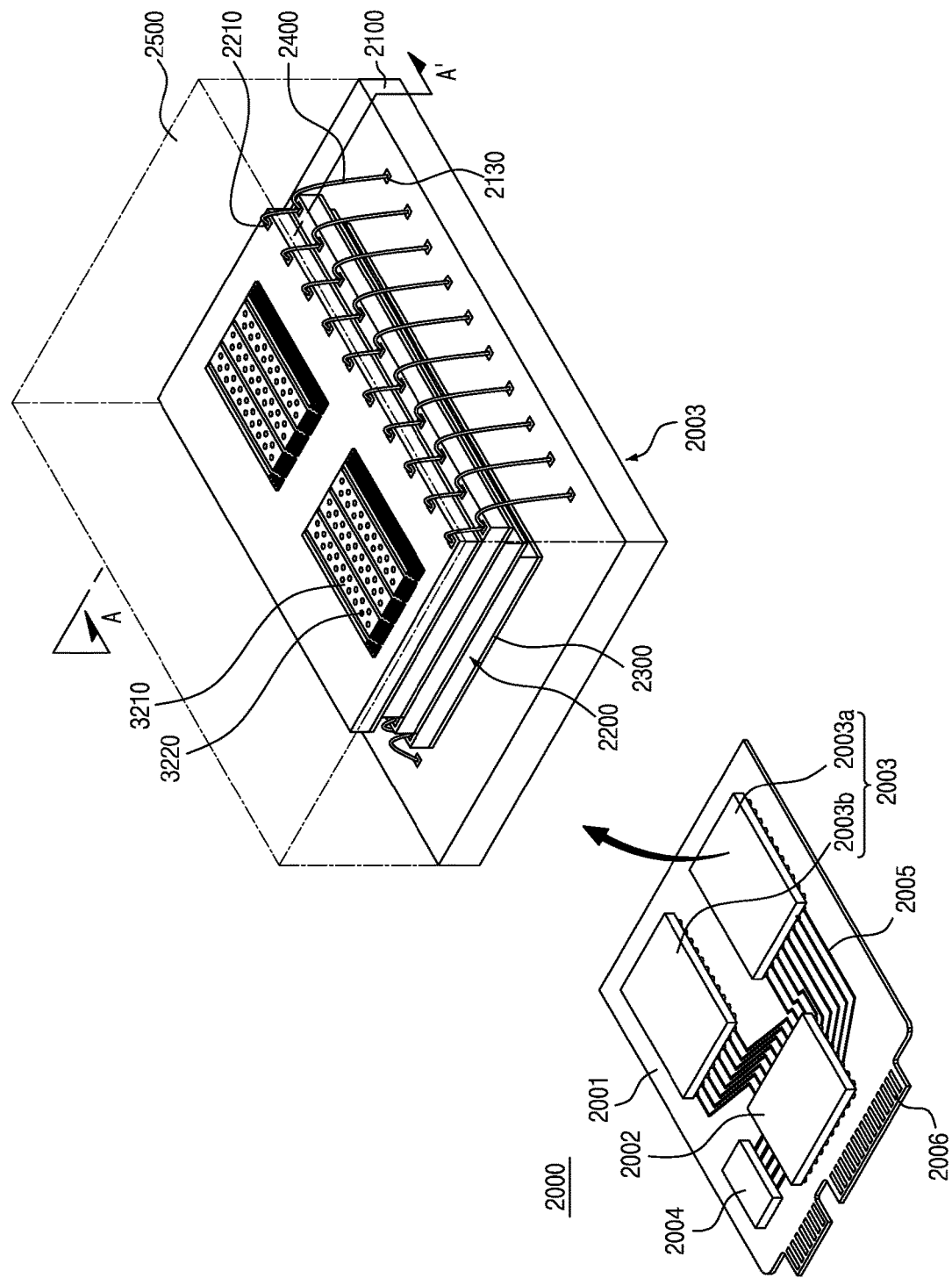
FIG. 25 is a schematic perspective view of an electronic system including a semiconductor device according to an example embodiment of the inventive concepts.

FIG. 25 is a schematic perspective view of an electronic system including a semiconductor device according to an example embodiment of the inventive concepts.

Referring to FIG. 25, an electronic system 2000 according to an exemplary embodiment of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In exemplary embodiments, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In exemplary embodiments, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may also provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 respectively disposed at lower surfaces of the semiconductor chips 2200, a connecting structure 2400 for electrically connecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include input/output pads 2210. The input/output pads 2210 may correspond to the input/output pads 1101 of FIG. 24. Each of the semiconductor chips 2200 may include gate stack structures 3210 and memory channel structures 3220. Each of the semiconductor chips 2200 may include a semiconductor device described with reference to FIGS. 1 to 4.

In exemplary embodiments, the connecting structure 2400 may be bonding wires for electrically connecting the input/output pads 2210 and the package upper pads 2130, respectively. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including a through-silicon via (TSV) in place of the bonding wire type connecting structure 2400.

In exemplary embodiments, the controller 2002 and the semiconductor chips 2200 may be included in one package. In an exemplary embodiment, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 26:
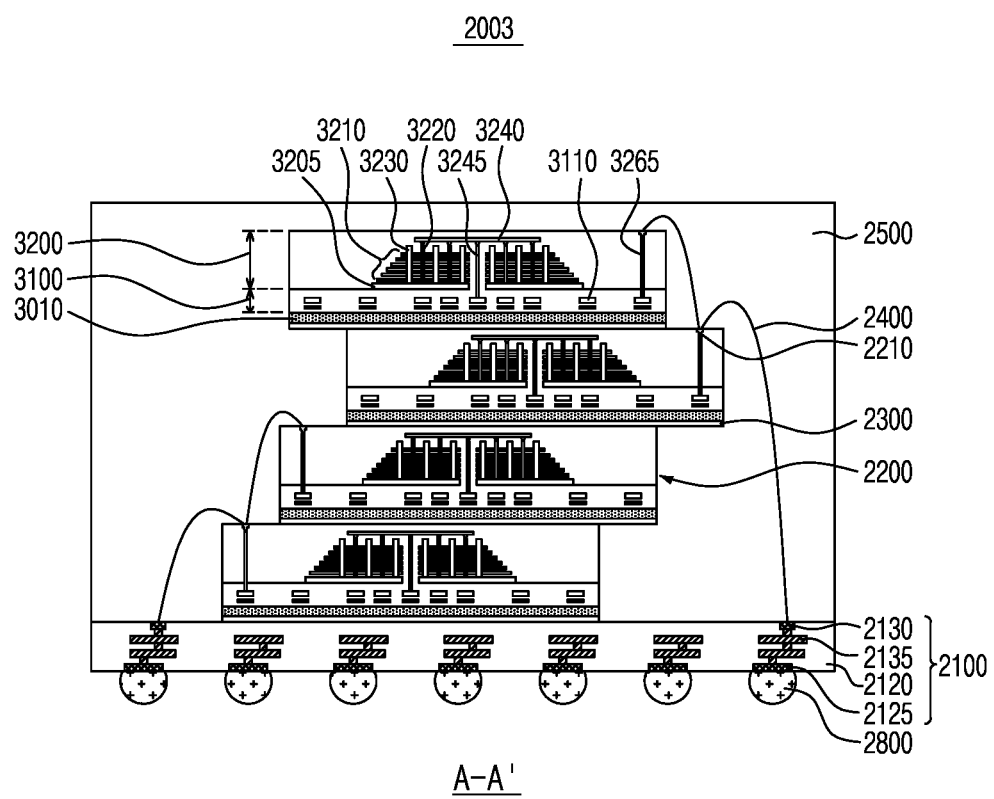
FIG. 26 is a schematic cross-sectional view of a semiconductor package according to an example embodiment of the inventive concepts.

FIG. 26 is a schematic cross-sectional view of a semiconductor package according to an example embodiment of the inventive concepts. FIG. 26 explains an exemplary embodiment of the semiconductor package 2003 of FIG. 25, and conceptually shows an area of the semiconductor package 2003 taken along line A-A' in FIG. 25.

Referring to FIG. 26, in the semiconductor package 2003, the package substrate 2100 thereof may be a printed circuit board. The package substrate 2100 may include a package substrate body 2120, package upper pads 2130 disposed at an upper surface of the package substrate body 2120, lower pads 2125 disposed at a lower surface of the package substrate body 2120 or exposed through the lower surface of the package substrate body 2120, and inner wirings 2135 electrically connecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 25.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a lower source conductive pattern 3205, a gate stack structure 3210 on the lower source conductive pattern 3205, memory channel structures 3220 and word line separation layers 3230 extending through the gate stack structure 3210, bit lines 3240 electrically connected to the memory channel structures 3220, and gate contact plugs (for example, "CP" in FIG. 3) electrically connected to word lines ("115" and "135" in FIG. 3) of the gate stack structure 3210. Upon viewing the second structure 3200 of FIG. 26 in an enlarged state, the second structure 3200 may include a semiconductor device of FIGS. 2 and 3. In detail, the second structure 3200 may include an interlayer insulating layer (for example, "116" and "136" in FIG. 3) covering the gate stack structure 3210.

Each of the semiconductor chips 2200 may include a through wiring 3245 electrically connected to the peripheral wirings 3110 of the first structure 3100 while extending into the second structure 3200. The through wiring 3245 may extend through the gate stack structure 3210, and may be further disposed outside the gate stack structure 3210. Each of the semiconductor chips 2200 may further include an input/output connecting wiring 3265 electrically connected to the peripheral wirings 3110 of the first structure 3100 while extending into the second structure 3200, and an input/output pad 2210 electrically connected to the input/output connecting wirings 3265.

In accordance with the exemplary embodiments of the disclosure, it may be possible to reduce a horizontal width difference between upper and lower ends of a contact plug.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. A semiconductor device comprising:
a substrate including a cell array area and an extension area;
a lower memory stack disposed on the substrate and including a plurality of lower gate electrodes vertically stacked and spaced apart from one another, the lower memory stack including, at the extension area, a lower staircase structure in which the plurality of lower gate electrodes are stacked to have a staircase shape;
an upper memory stack disposed on the lower memory stack and including a plurality of upper gate electrodes vertically stacked and spaced apart from one another, the upper memory stack including, at the extension area, an upper staircase structure in which the plurality of upper gate electrodes are stacked to have a staircase shape;
a plurality of channel structures extending through the lower memory stack and the upper memory stack at the cell array area;
a lower interlayer insulating layer doped with an impurity and covering the lower staircase structure, the lower interlayer insulating layer having a doping concentration gradually increasing toward the lower staircase structure;

an upper interlayer insulating layer doped with an impurity and covering the upper staircase structure and the lower interlayer insulating layer, the upper interlayer insulating layer having a doping concentration gradually increasing toward the upper staircase structure and the lower interlayer insulating layer;

a plurality of lower contact plugs contacting the plurality of lower gate electrodes of the lower staircase structure; and a plurality of upper contact plugs contacting the plurality of upper gate electrodes of the upper staircase structure, wherein:

the lower interlayer insulating layer includes a first lower doping region extending along an upper surface of the lower staircase structure;

the upper interlayer insulating layer includes a first upper doping region extending along an upper surface of the upper staircase structure and an upper surface of the lower interlayer insulating layer, and the first upper doping region contacts the first lower doping region; and a doping concentration of the first lower doping region is higher than a doping concentration of the first upper doping region.

2. The semiconductor device according to claim 1, wherein each of the plurality of lower contact plugs contacts the first lower doping region and the first upper doping region, and each of the plurality of upper contact plugs contacts the first upper doping region.

3. The semiconductor device according to claim 1, wherein the lower interlayer insulating layer further includes a second lower doping region on the first lower doping region, and a third lower doping region on the second lower doping region, and the first upper doping region contacts the second lower doping region and the third lower doping region.

4. The semiconductor device according to claim 1, wherein:

the plurality of lower contact plugs include a first lower contact plug and a second lower contact plug;

the first lower contact plug is nearer to the cell array area than the second lower contact plug; and a horizontal width of a lower surface of the first lower contact plug is greater than a horizontal width of a lower surface of the second lower contact plug, and a horizontal width of the first lower contact plug gradually increases toward a bottom thereof.

5. The semiconductor device according to claim 1, wherein:

the plurality of upper contact plugs include a first upper contact plug and a second upper contact plug;

the first upper contact plug is nearer to the cell array area than the second upper contact plug; and a horizontal width of a lower surface of the first upper contact plug is greater than a horizontal width of a lower surface of the second upper contact plug, and a horizontal width of the first upper contact plug gradually increases as a bottom thereof.

6. The semiconductor device according to claim 1, wherein:

the plurality of upper contact plugs include a first upper contact plug and a second upper contact plug;

the first upper contact plug is nearer to the cell array area than the second upper contact plug;

the first upper contact plug and the second upper contact plug have a first width and a second width at a same level as an upper surface of the upper interlayer insulating layer, respectively; and the first width is greater than the second width.

7. The semiconductor device according to claim 6, further comprising:

a first upper insulating layer on the upper interlayer insulating layer, wherein the first upper contact plug includes a step at a boundary surface between the first upper insulating layer and the upper interlayer insulating layer.

8. The semiconductor device according to claim 6, wherein:

the plurality of lower contact plugs include a first lower contact plug and a second lower contact plug;

the first lower contact plug is nearer to the cell array area than the second lower contact plug;

the first lower contact plug and the second lower contact plug have a third width and a fourth width at a same level as the upper surface of the upper interlayer insulating layer, respectively; and the third width is greater than the fourth width.

9. The semiconductor device according to claim 8, wherein the second width is greater than the third width.

10. The semiconductor device according to claim 1, wherein at least one of the plurality of lower and upper contact plugs has an upper width at the upper interlayer insulating layer and a lower width at the lower interlayer insulating layer greater than the upper width, and includes a step at a boundary surface between the upper interlayer insulating layer and the lower interlayer insulating layer.

11. The semiconductor device according to claim 1, wherein:

at least one of the plurality of lower and upper contact plugs includes a step at a boundary surface between the lower interlayer insulating layer and the upper interlayer insulating layer; and at least one of the lower and upper contact plugs has an upper width at the upper interlayer insulating layer and a lower width at the lower interlayer insulating layer smaller than the upper width.

12. The semiconductor device according to claim 1, further comprising:

a peripheral circuit structure between the substrate and the lower memory stack;

a buried insulating layer between the peripheral circuit structure and the lower memory stack; and a through electrode extending vertically through the buried insulating layer, the lower interlayer insulating layer and the upper interlayer insulating layer, wherein the buried insulating layer is doped with an impurity, and a doping concentration of the buried insulating layer is higher than the doping concentration of the lower interlayer insulating layer.

13. The semiconductor device according to claim 1, wherein the lower interlayer insulating layer and the upper interlayer insulating layer include boron (B), phosphorous (P), fluorine (F), or a combination thereof.

14. A semiconductor device comprising:

a peripheral circuit structure including a substrate, the substrate including a cell array area and an extension area;

a lower conductive layer on the peripheral circuit structure;

a supporter on the lower conductive layer;

a memory stack disposed on the supporter and including a plurality of gate electrodes vertically stacked and spaced apart from one another, the memory stack including, at the extension area, a staircase structure in which the plurality of gate electrodes are stacked to have a staircase shape;

a plurality of channel structures extending through the memory stack at the cell array area;

an interlayer insulating layer doped with an impurity and covering the staircase structure, the interlayer insulating layer including a first doping region, a second doping region on the first doping region, and a third doping region on the second doping region; and a plurality of contact plugs contacting the plurality of gate electrodes of the staircase structure, wherein the first doping region extends along an upper surface of the staircase structure and extending horizontally along an upper surface of the supporter, wherein a doping concentration of the interlayer insulating layer gradually increases toward the staircase structure and the supporter.

15. The semiconductor device according to claim 14, wherein each of the plurality of contact plugs contacts the first doping region.

16. The semiconductor device according to claim 14, wherein:
the plurality of contact plugs include a first contact plug and a second contact plug;
the first contact plug is nearer to the cell array area than the second contact plug;
a horizontal width of a lower surface of the first contact plug is greater than a horizontal width of a lower surface of the second contact plug; and
a horizontal width of the first contact plug gradually increases toward a bottom thereof.

17. An electronic system comprising:
a main substrate;
a semiconductor device on the main substrate; and
a controller electrically connected to the semiconductor device on the main substrate,
wherein the semiconductor device includes:
a substrate including a cell array area and an extension area,
a lower memory stack disposed on the substrate and including a plurality of lower gate electrodes vertically stacked and spaced apart from one another, the lower memory stack including, at the extension area, a lower staircase structure in which the plurality of lower gate electrodes are stacked to have a staircase shape,
an upper memory stack disposed on the lower memory stack and including a plurality of upper gate electrodes vertically stacked and spaced apart from one another, the upper memory stack including, at the extension area, an upper staircase structure in which the plurality of upper gate electrodes are stacked to have a staircase shape,
a plurality of channel structures extending through the lower memory stack and the upper memory stack at the cell array area,
a lower interlayer insulating layer doped with an impurity and covering the lower staircase structure, the lower interlayer insulating layer having a doping concentration gradually increasing toward the lower staircase structure,
an upper interlayer insulating layer doped with an impurity and covering the upper staircase structure and the lower interlayer insulating layer, the upper interlayer insulating layer having a doping concentration gradually increasing toward the upper staircase structure and the lower interlayer insulating layer,
a plurality of lower contact plugs contacting the plurality of lower gate electrodes of the lower staircase structure,
a plurality of upper contact plugs contacting the plurality of upper gate electrodes of the upper staircase structure,
a peripheral circuit structure between the substrate and the lower memory stack,
an input/output pad electrically interconnecting the peripheral circuit structure and the controller to each other,
a buried insulating layer between the peripheral circuit structure and the lower memory stack, and
a through electrode extending vertically through the buried insulating layer, the lower interlayer insulating layer and the upper interlayer insulating layer, wherein the buried insulating layer is doped with an impurity, and a doping concentration of the buried insulating layer is higher than the doping concentration of the lower interlayer insulating layer.

18. The electronic system according to claim 17, wherein the main substrate further includes wiring patterns electrically interconnecting the semiconductor device and the controller to each other.

19. The electronic system according to claim 17, wherein:
the lower interlayer insulating layer includes a first lower doping region extending along an upper surface of the lower staircase structure and an upper surface of the buried insulating layer;
the upper interlayer insulating layer includes a first upper doping region extending along upper surfaces of the upper staircase structure and the lower interlayer insulating layer, and the first upper doping region contacts the first lower doping region; and
a doping concentration of the first lower doping region is higher than a doping concentration of the first upper doping region.

* * * * *